(12) United States Patent
Fulkerson, Jr.

(10) Patent No.: US 9,178,334 B2
(45) Date of Patent: Nov. 3, 2015

(54) ARBITRARY WAVEFORM GENERATOR TO IMPROVE LASER DIODE DRIVER PERFORMANCE

(71) Applicant: Lawrence Livermore National Security, LLC, Livermore, CA (US)

(72) Inventor: Edward Steven Fulkerson, Jr., Livermore, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 14/378,622

(22) PCT Filed: Feb. 21, 2013

(86) PCT No.: PCT/US2013/027169
§ 371 (c)(1),
(2) Date: Aug. 13, 2014

(87) PCT Pub. No.: WO2013/172900
PCT Pub. Date: Nov. 21, 2013

(65) Prior Publication Data
US 2015/0036707 A1 Feb. 5, 2015

Related U.S. Application Data

(60) Provisional application No. 61/602,037, filed on Feb. 22, 2012.

(51) Int. Cl.
*H01S 3/00* (2006.01)
*H01S 5/062* (2006.01)
(Continued)

(52) U.S. Cl.
CPC ........... *H01S 5/06223* (2013.01); *H01S 5/0428* (2013.01); *H01S 5/06808* (2013.01); *H01S 5/06835* (2013.01); *H01S 3/0941* (2013.01); *H01S 5/4025* (2013.01)

(58) Field of Classification Search
CPC .............. H01S 3/302; H01S 3/094003; H01S 3/094073; H01S 3/094096; H01S 3/1022; H01S 2301/04; H01S 3/06725; H01S 3/094042; H01S 3/09415; H01S 3/10007; H01S 5/02252; H01S 5/141; H01S 5/146
USPC .............. 372/38.01, 29.011, 29.012, 29.014, 372/29.015, 29.021, 38.02, 38.04, 38.07
See application file for complete search history.

(56) References Cited

U.S. PATENT DOCUMENTS

| 5,123,023 A | 6/1992 | Santarelli et al. |
| 5,548,404 A | 8/1996 | Kupershmidt et al. |

(Continued)

FOREIGN PATENT DOCUMENTS

JP 2015-508242 3/2015

OTHER PUBLICATIONS

Gouaux, et al., "Absolute distance measurement with an optical feedback interferometer", Applied Optics, vol. 37, No. 28, pp. 6684-6689 (Oct. 1, 1998).

(Continued)

*Primary Examiner* — Xinning Niu
*Assistant Examiner* — Vu A Vu
(74) *Attorney, Agent, or Firm* — Kilpatrick Townsend & Stockton LLP

(57) ABSTRACT

An arbitrary waveform generator modifies the input signal to a laser diode driver circuit in order to reduce the overshoot/undershoot and provide a "flat-top" signal to the laser diode driver circuit. The input signal is modified based on the original received signal and the feedback from the laser diode by measuring the actual current flowing in the laser diode after the original signal is applied to the laser diode.

22 Claims, 23 Drawing Sheets

(51) Int. Cl.
  *H01S 5/042* (2006.01)
  *H01S 5/068* (2006.01)
  *H01S 5/0683* (2006.01)
  *H01S 3/0941* (2006.01)
  *H01S 5/40* (2006.01)

(56) References Cited

U.S. PATENT DOCUMENTS

| | | | |
|---|---|---|---|
| 5,623,355 A | | 4/1997 | Olsen |
| 5,946,334 A | * | 8/1999 | Ema et al. ............... 372/38.01 |
| 7,088,276 B1 | * | 8/2006 | Wegener ............... 341/155 |
| 7,711,018 B2 | | 5/2010 | Champion et al. |
| 7,787,507 B2 | * | 8/2010 | Miller ............... 372/38.01 |
| 2002/0190666 A1 | | 12/2002 | Sakamoto et al. |
| 2007/0127530 A1 | * | 6/2007 | Pan et al. ............... 372/38.02 |
| 2011/0305256 A1 | | 12/2011 | Chann et al. |

OTHER PUBLICATIONS

Madaras, et al., "Psuedo-random modulation of a laser diode for generating ultrasonic longitudinal waves", AIP Conference Proceedings, 509, pp. 303-309 (2000).

* cited by examiner

~ 300

| No. of Bits | Data Type | Additional Information |
|---|---|---|
| 16 | Frame Sysnc | |
| 10 | Address for laser diode driver | |
| 10 | Current level information | Range of 0-550 Amps |
| 9 | Pluse duration (width) | Range of up to 300 microseconds |
| 1 | Trigger Signal | "fire now" signal |
| 16 | Error Check | E.g. CRC |
| 18 | unused | Future definition |

FIG. 3

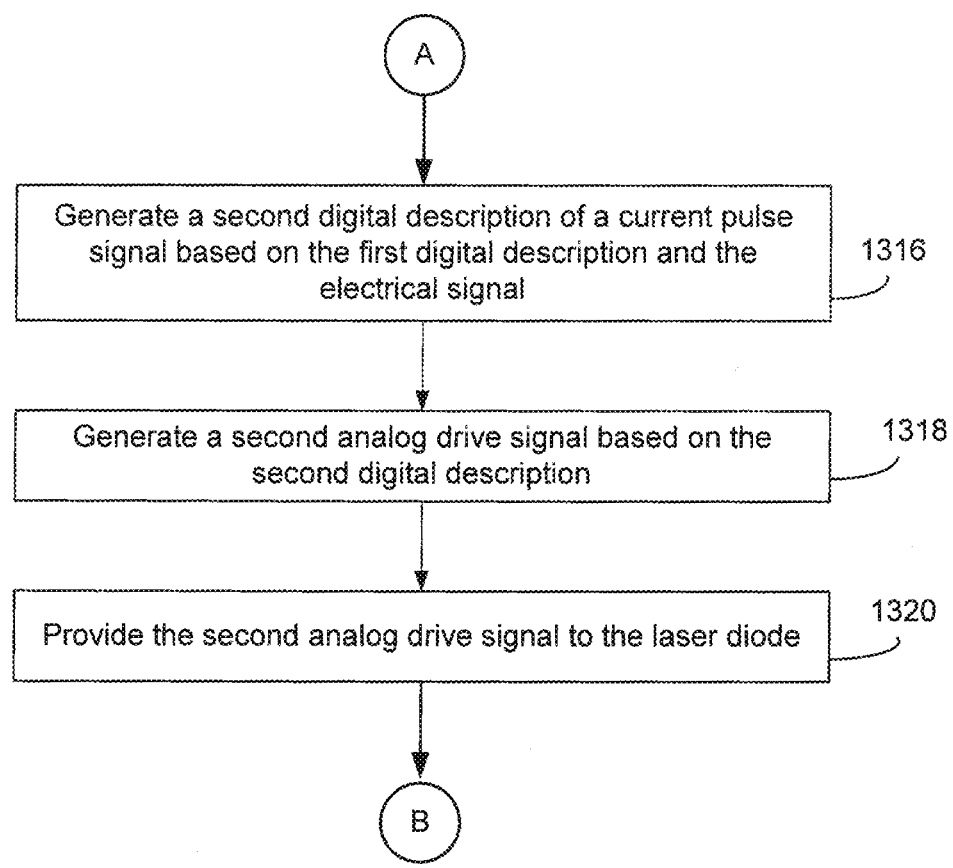
FIG. 13 Contd...

```
//*********************************************************************
//                 // MSP430F2274EP - AWG Receiver
//                 //
// This program is a receiver of a 1Mhz bi-phase optical communication
// stream that will be used to control the Smart Tile Diode Pulser.
//                 //
// -----------------------I/O definitions ------------------------------
//          // P4.0 - Pin 17 - Serial Data input - CCI0A input
//             // P1.0 - Pin 31 - LSB D/A Converter
//                    // P1.1 - Pin 32 - *
//                    // P1.2 - Pin 33 - *
//                    // P1.3 - Pin 34 - *
//                    // P1.4 - Pin 35 - *
//                    // P1.5 - Pin 36 - *
//                    // P1.6 - Pin 37 - *
//                    // P1.7 - Pin 38 - *
//                    // P2.0 - Pin 8  - *
//                    // P2.1 - Pin 9  - *
//                    // P2.2 - Pin 10 - *
//             // P2.3 - Pin 29 - MSB D/A Converter
//                // P3.0 - Pin 11 - Green LED
//                // P3.1 - Pin 12 - Red Led
//                // P3.2 - Pin 13 - Amber LED
//          // P2.4 - Pin 30 - Latch signal to D/A Converter
//                 //
// ----------------------- Revision History ----------------------------
//                    // Steve Telford
//                    // LLNL
// Implemented using IAR IDE Version 5.10.1 [Kickstart] (5.10.1.30144)
//                 //
//       // Based on ID Tag - Steve Telford - June 2010
//                 //
//       // 11/21/12 - Start of Code development
//          // 12/17/12 - Added CRC Checker
// 12/21/12 - World didn't end, added start of receiver code
//*********************************************************************
```

FIG. 15

```
// ---------------------------Definitions-----------------------------------
//
#include "io430.h"              // This defines the I/O
include "intrinsics.h"         // Functions intrinisic to the MSP430 define RXD       0x04          // Receive Port on P1.2
define testLED   0x01          // Test fixture LED on P1.0
#define RedLED    0x01          // Red IED on P3.0
#define GreenLED  0x04          // Green LED on P3.1
#define AmberLED  0x02          // Amber LED on P3.2
#define LEDs      0x07          // All indicator Led's
#define TRUE      1             // True & False flags
#define FALSE     0

// Conditions for 100 kHz communications link & 16MHz clock
#define Bitime    160           // 100 KHz data rate
#define Bitime_25 40            // 0.25 of a bit length
#define Bitime_5  80            // 0.5 of a bit length
define MessageSize 8           // message size is 6 bytes // Definitions unique to the pulser
define myaddr    159           // Pulser address
#define listenall 255           // Listen all address
#define maxBP     24            // # of beakpoints allowed
#define time      0             // time index in BP array
define value     1             // amplitude index in BP array // ---------------------- Variables & Functions ----------------------
unsigned int i,j,n,bit,CMD;
unsigned int BitCnt,MessageOK,Message_Received,ByteCnt;
unsigned char incCRC,RXByte;
char message[8];                // Incomming message is stored here float timedif_float,ampdif_float;   // floating point time & ampitude differences
float WF_float,newval_float;        // flaoting point WF values
float valinc_float;                 // incremental value
int timedif_int,newval_int;         // integer time difference & new value
int WF[351];                        // Waveform stored here - integer
int BP[maxBP][2], nextBP;           // Received breakpoints stored here void FlashLED(unsigned char volatile *PORT, int LED);
int CRCcheck(int messageLen);
void RX_Ready(void);
int ADDRcheck(unsigned char addr);
```

FIG. 15 Contd...

```
// ---------------- Command Declarations ----------------
void NoCommand(void);
void Trigger(void);
void Build(void);
void SetBreakpoint(char *pchar);
void ClearBrekpoints(void);
void Stop(void);
void BadCommand(void);

// ---------------- Start of Code ----------------
int main( void )
{
  WDTCTL = WDTPW + WDTHOLD;          // Stop watchdog timer P3OUT = 0x00;                      // Turn the LED's OFF to start
  P3DIR |= 0x07;                     // Set the 3 LEDs up as outputs
  P1DIR |= 0x01;                     // Set the test LED direction
  Message_Received = FALSE;

for (n=0; n!=10; ++n)              // Flash the LED 5 times at start up
  {
    volatile unsigned int i;         // declare a local variable
    P1OUT ^= 0x01;                   // Toggle P1.0 using an exclusive OR
    i = 10000;                       // Delay
    do i--;
    while (i !=0);
  }
  P1OUT &= ~testLED;                 // Turn OFF the LED message[0] = 'A';
  message[1] = 'B';

DCOCTL = CALDCO_16MHZ;             // Set the internal DCO to 16MHz
  BCSCTL1 = CALBC1_16MHZ;            // MCLK = DCOCLK / 1
  BCSCTL2 = 0x00;                    // SMCLK = DCOCLK / 1
  BCSCTL3 = 0x00;                    // DCO Resistor - Internal
```

FIG. 15 Contd...

```
// -------------------------Main Loop -------------------------
   for (;;)
   {
     RX_Ready();              // Set up the port to receive
     __bis_SR_register(LPM1_bits + GIE);   // Enter LPM1 with interrupts ON }
 }
// -------------------- Flash an LED --------------------------
void FlashLED (unsigned char volatile *PORT, int LED)
{
  volatile unsigned int m;
  *PORT |= LED;               // Turn ON the LED
  m = 50000;                  // Set the ON time
  do m--;                     // wait
  while (m != 0);
  *PORT &= ~LED;              // Turn OFF the LED
}

// ---------------- Ready the COM port to Receive ----------------
void RX_Ready(void)
{
  P4SEL = 0x01;               // Set P4 to timer function
  BitCnt = 0x0008;            // Load the bit Counter to 8
  ByteCnt = 0;                // Load Byte Counter to 6
  n =1000;                    // Put in some delay
  do n--;                     // allow time for interrupts to clear
  while (n !=0 );
                              // Set Up timer B
  TBCTL = TBSSEL_2 + CNTL_0 + ID_0 + MC_2;
                              // TBSSL_2 = SMCLK
                              // CNTL_0 = 16 Bit Counter Length
                              // ID_0 = Input Divder = 1
                              // MC_2 = Continuous Mode TBCCTL0 = CM_1 + CCIS_0 + CAP + OUTMOD_1 + CCIE;
                              // Tmier B, Capture/Control Reg 0
                              // CM_2 = 2*0x8000 - Falling Edge
                              // CCIS_0 = 0x1000 = CCI0A input
                              // CAP = 0x0100 = Capture Mode
                              // OUTMOD_1 = 1x0x0020 = SET
                              // CCIE = 0x0010 = Interupt Enabled __bis_SR_register(GIE);     // Turn On General Interupt Enable
}
```

FIG. 15 Contd...

```
// ---------------------- CRC Checker ----------------------------------
int CRCcheck(int messageLen)        // 8-bit CRC, polynomial = '0x107'
{
  unsigned char checkbyte;
  incCRC = 0x00;                    // Preset Incremental CRC to '0x00'
  for(i=0; i<messageLen-1; i++)     // Loop through all the bytes
  {
    checkbyte = incCRC ^ message[i];   // XOR message byte with Incremental CRC
    for(j=0; j<8; j++)              // Loop through all the bits
    {
      if(checkbyte & 0x80)          // Check the MSB for a '1'
      { checkbyte = checkbyte<<1;   // Left shift 1 bit
        checkbyte = checkbyte ^ 0x07;   // XOR with 0x07
      }
      else
      { checkbyte = checkbyte<<1;   // Left shift 1 bit
        checkbyte = checkbyte ^ 0x00;   // XOR with 0 to keep timing the same
      }
    }
    incCRC = checkbyte;             // move the result to 'incCRC'
  }
  if(incCRC == message[messageLen-1])    // Loop complete check the result
    return(TRUE);                   // TRUE for Good
  else
    return(FALSE);                  // FALSE for Bad
}

// ---------------------- Address Checker ------------------------------
int ADDRcheck(unsigned char addr)
{
  P3OUT &= ~LEDs;
  if( addr == myaddr ) {
    P3OUT |= GreenLED;
    return(TRUE);
  }
  if( addr == listenall ) {
    P3OUT |= AmberLED;
    return(TRUE);
  }
  else return(FALSE);
}

// ------------------ No Command ---------------------------------
void NoCommand(void)
{
  return;
}

// ------------------ Trigger the Pulser -------------------------
void Trigger(void)
{
  return;
}
```

FIG. 15 Contd...

```c
// -------------Build a Waveform -------------
void Build(void)
{
  int nexttime, nextvalue;

nexttime = BP[0][time];           // fill in first BP
  nextvalue = BP[0][value];
  WF[nexttime] = nextvalue;
  for (i=1; i<nextBP; i++) {
    nexttime = BP[i][time];         // get the next time from BP table
    nextvalue = BP[i][value];       // get the next amplitude from the BP table
    WF[nexttime] = nextvalue;       // put the amplitude in the waveform timedif_int = BP[i][time] - BP[i-1][time];     // integer time difference
    timedif_float = BP[i][time] - BP[i-1][time];   // floating point time difference
    ampdif_float = BP[i][value] - BP[i-1][value];  // floating point amplitude difference
    valinc_float = ampdif_float / timedif_float;   // incremental amplitude
    WF_float = WF[nexttime];                        // Convert to float
    for (j=1; j<timedif_int; j++) {                 // fill in between breakpoints
      newval_float = WF_float - valinc_float*(j);   // calc float value
      newval_float += 0.499;                        // rounding factor
      newval_int = (int)newval_float;               // convert to integer
      WF[nexttime-j] = newval_int;                  // Fill in table
    }
    FlashLED(&P1OUT,testLED);
  }
  return;
}
// -------------Set a Breakpoint -------------
void SetBreakpoint(char *pchar)
{
  BP[nextBP][time] = (*pchar << 8) | *(pchar+1);
  BP[nextBP][value] = (*(pchar+2) << 8) | *(pchar+3);
  if(nextBP < (maxBP-1)) nextBP += 1;
  return;
}

// ------------- Clear all Breakpoints -------------
void ClearBreakpoints(void)
{
  for( n=0; n<maxBP; n++) {
    BP[n][0] = 0;
    BP[n][1] = 0;
  }
  nextBP = 0;
  return;
}

// ------------- Stop the AWG -------------
void Stop(void)
{
  return;
}
```

FIG. 15 Contd...

```
// ---------------- Process a Bad Command ----------------------------------
void BadCommand(void)
{
  P3OUT |= RedLED;
  P3OUT |= AmberLED;
  P3OUT &= ~GreenLED;
  return;
}
// ---------------- Timer B/CCR0 Interrupt Service Routine ----------------
#pragma vector=TIMERB0_VECTOR
__interrupt void Timer_B_CCR0 (void)
{
  TBCCTL0 &= ~CCIFG;                 // We got here so turn OFF the interrupt if( TBCCTL0 & CAP )                // In Capture mode at stsrt of tranmission
  {
    TBCCTL0 &= ~CAP;                 // Switch from Capture to Compare Mode
    TBCCR0 += Bitime_5;              // wait for 0.5 bit time
    __bic_SR_register_on_exit(SCG1 + SCG0);  // Leave the DCO on & Wait
  }
  else
  {
    TBCCR0 += Bitime;                // set up to wait 1.0 bit time
    RXByte = RXByte << 1;            // Left Shift RXWord 1 bit
    if (CCI & TBCCTL0) RXByte |= 0x01;  // Set the LSB to receive bit value
    BitCnt --;                       // Decrement the bit counter
    if (BitCnt == 0)
```

FIG. 15 Contd...

```
{
    message[ByteCnt] = RXByte;          // Move byte to message array
    ByteCnt += 1;                       // Increment the Byte Count
    if (ByteCnt == MessageSize ) {      // Check for all bytes
      TBCCTL0 &= ~CCIE;                 // All bits received, disable interrupt
      __bic_SR_register_on_exit(LPM1_bits);  // Clear LPM1 bits from SR
      FlashLED(&P1OUT,testLED);         // Flash the LED for message
      if (CRCcheck(MessageSize)) {      // Check the CRC
        if (ADDRcheck(message[1])) {    // Check the address
          CMD = message[2];             // Extract the command
          switch (CMD) {                // Decode the command & act
            case 0:
              NoCommand();              // No Command
              break;
            case 1:
              Trigger();                // Trigger the pulser
              break;
            case 2:
              Build();                  // Build the waveform
              break;
            case 3:
              SetBreakpoint(&message[3]);  // Receive a breakpoint
              break;
            case 4:
              ClearBreakpoints();       // Clear all Breakpoints
              break;
            case 5:
              Stop();                   // Stop all action
              break;
            default:
              BadCommand();             // Bad command received
              break;
          }
        }
      }
      else
        P3OUT = RedLED;                 // Red LED ON if Bad CRC
    } else {
      BitCnt = 0x0008;                  // reset the bit count
    }
  }
 }
}
```

FIG. 15 Contd...

ARBITRARY WAVEFORM GENERATOR TO IMPROVE LASER DIODE DRIVER PERFORMANCE

CROSS-REFERENCES TO RELATED APPLICATIONS

This application claims priority under 35 USC §119(e) from U.S. Provisional Application No. 61/602,037 filed on Feb. 22, 2012, the content of which is incorporated by reference herein in its entirety for all purposes.

STATEMENT AS TO RIGHTS TO INVENTIONS MADE UNDER FEDERALLY SPONSORED RESEARCH AND DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND

High average power diode pumped lasers are currently being used in or designed into an increasing number of laser systems. Diode-pumped solid state lasers are used in various applications ranging from laser pointers to nuclear fusion engines. In applications where a large number of such lasers are to be controlled with a very high accuracy, conventional means of controlling the lasers are proving to be ineffective.

Despite progress made in methods and systems for controlling large diode-pumped solid state laser (DPSSL) arrays, there is a need in the art for improved methods and systems related to accurate control of individual laser diodes and large DPSSL arrays.

SUMMARY

Embodiments of the present invention are generally related to operation of a laser diode. Specifically, certain embodiments of the present invention provide a specific method of operating a laser diode using an arbitrary waveform generator. Using the techniques disclosed herein, it is possible to dynamically vary the current applied to a laser diode to effect the output of the laser diode. In other words, techniques disclosed herein enable a fine control of current applied to a laser diode and provide the ability to vary that current in small increments of time (e.g., few microseconds) over any given time to get the desired output from the laser diode. This allows a greater flexibility in the operation of a laser diode and makes this system especially suitable for any application that may need varying output from a laser diode over time. Also, since the system disclosed herein includes a self-correcting feedback mechanism, the system is virtually self-regulating and hence more reliable and accurate.

A particular embodiment of the present invention provides a method for operating a laser diode. The method can be performed by a specialized control circuit and includes receiving a digital description of a current pulse. In one embodiment, the digital description includes information about a current level, duration, and modulation of the current applied to a laser diode. The method further includes generating an analog drive signal corresponding to the digital description of the current pulse and communicating the analog drive signal to a laser diode driver circuit. Thereafter, the method includes receiving information indicative of current flow through the laser diode upon application of the analog drive signal and generating a new digital description of the current pulse based on the digital description of the current pulse and the information indicative of the current flow through the laser diode. Thereafter a new analog drive signal corresponding to the new digital description of the current pulse is generated and provided to the laser diode driver circuit.

Another embodiment of the present invention provides a different method of controlling operation of a laser diode. The method includes receiving first digital information indicating a current pulse to be applied to a laser diode. The current pulse may have amplitude, duration, and modulation. The amplitude is indicative of a peak current value and the duration is indicative of a time period for which the current value is to be applied to the laser diode. The method further includes generating a first analog drive signal corresponding to the first digital information and providing the first analog drive signal to a laser diode driver coupled to the laser diode. The method also includes receiving second digital information indicating a new current pulse to be applied to a laser diode. The second digital information is based on the first digital information and actual current flowing through the laser diode when the current value is applied to the laser diode. The method further includes generating a second analog drive signal corresponding to the second digital information and providing the second analog drive signal to the laser diode driver coupled to the laser diode. In a particular embodiment, the method includes storing the second digital description in a memory for subsequent use.

In an embodiment the method is performed by a control circuit that includes an arbitrary waveform generator. In another embodiment, the actual current flowing through the laser diode is measured using a current sensing device coupled to the laser diode. An example of the current sensing device is a resistor. In another embodiment, a photodiode may be used to capture the light output from the laser diode and based on that the control circuit may determine the current flowing in the laser diode. In yet another embodiment, a beam control unit receives information about the actual current flowing through the laser diode when the current value is applied to the laser diode. The beam control unit then determines that the actual current flowing through the laser diode is not substantially equal to the current value applied to the laser diode and generates the second digital information indicating a new current pulse to be applied to the laser diode.

In some embodiments, a system for operating a laser diode is provided. The system includes a control circuit, a laser diode driver circuit coupled to the control circuit, a laser diode coupled to the laser diode driver circuit, and a current measuring device coupled to the laser diode. The current measuring device can measure current flow through the laser diode or capture light output from the laser diode, which can be used to determine the current flowing through the laser diode. In this system, the control circuit can receive first digital information for a current pulse to be applied to the laser diode. The current pulse may have fixed or varying amplitude and duration, wherein the amplitude is indicative of a current value and the duration is indicative of a time period for which the current value is to be applied to the laser diode. The control circuit can generate a first analog drive signal corresponding to the first digital information and provide the first analog drive signal to the laser diode driver circuit. Further, the control circuit can receive, from a beam control unit, second digital information indicating a new current pulse to be applied to the laser diode. In some embodiments, the second digital information can be based on the first digital information and actual current flowing through the laser diode that is determined by the current measuring device. The control circuit can then generate a second analog drive signal corresponding to the second digital information and provide the second analog drive signal to the laser diode driver circuit for application to the laser diode. In a particular embodiment, the control circuit can itself generate the second digital information based on input received from the current measuring device.

In some embodiments, the system also includes a beam control system that can generate the first digital information and the second digital information. The beam control system can receive, from the current measuring device, the information about the actual current flowing through the laser diode and generate the second digital information based at least in part on the information about the actual current flowing through the laser diode.

The following detailed description, together with the accompanying drawings will provide a better understanding of the nature and advantages of the present invention.

BRIEF DESCRIPTION OF THE DRAWINGS

FIG. 3 is table illustrating format for the data received by the optical receiver according to an embodiment of the present invention.

FIG. 15 is a sample code that may be used in operation of the system according to an embodiment of the present invention.

DETAILED DESCRIPTION

Figure 1:
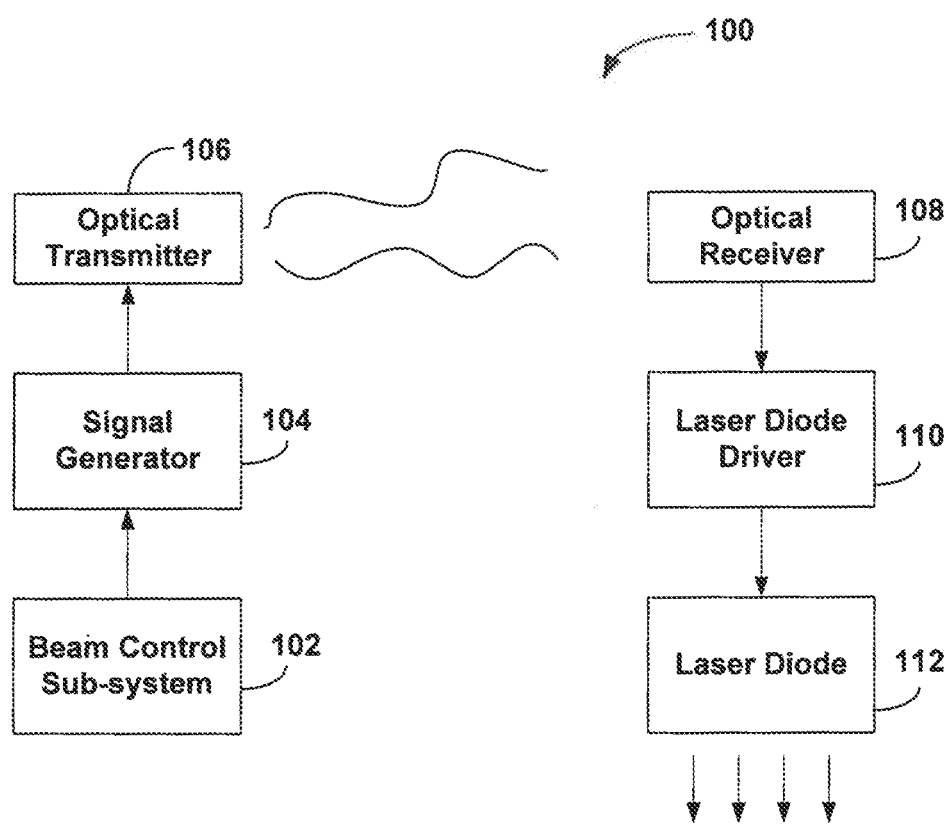
FIG. 1 is a functional block diagram of a system for controlling a laser diode according to an embodiment of the present invention.

Embodiments of the present invention generally relate to lasers. Certain embodiments of the present invention provide methods and systems for controlling a single laser diode or an array of laser diodes in order to provide precise operation of each of the laser diodes in the array.

High average power diode laser arrays used for pumping of laser amplifiers, which may be used for IFE (Inertial Fusion Engine) power plants, utilize power conditioning systems to pulse the diode laser arrays at precise currents, pulse rates, and duty factors. Precise control of the current levels, pulse rates, and timing to trigger the laser diodes in the array is needed in order to generate optimum conditions in the IFE power plants.

Conventionally, each of the laser diode in an array was wired to a central control system that provided the signal to indicate when to fire the laser as well as the current level that was to be provided to the laser diode and the duration for which the current pulse was to be applied to the laser diode (also known as the pulse rate). Wired-based signaling systems have a certain latency associated with them. Latency is a measure of time delay experienced in a system. In a laser diode array system, the end-to-end latency can include the delay associated with control signal transmission between the laser controller to the laser diode, processing time of the laser diode driver to process the control signal and delay associated with a laser diode receiving the current from the laser driver and output a laser beam based on the parameters included in the control signal, etc. In addition, as the system ages, these latencies can increase, thereby resulting in the need for constant adjustment of the control signal in order to precisely control the operation/output of the laser diodes.

In an IFE power generation application, it is beneficial to have all the laser diodes fire at the same time in order to provide optimal energy to initiate the fusion reaction. If the laser diodes do not all fire at the same time, it may result in less energy being provided to the fusion engine, resulting in failure of the fusion reaction. As the wired-based systems age, not only does the system end-to-end latency change, but latency among individual connections to each laser diode may also vary, making it challenging to maintain precise operating parameters for these laser diodes. In addition, it is beneficial to control the output of the laser diodes within a narrow tolerance level since large variations in output from the laser diodes may adversely affect the fusion reaction.

Embodiments of the present invention provide optical control mechanisms in order to control the trigger time and other operational parameters of each individual laser diode. Many advantages are realized by embodiments of the present invention over conventional methods. By actively sensing the actual current flow in the laser diode, the input to each individual laser diode may be customized to prevent overshoot/undershoot and thus provide a more uniform output from each laser diode during the active periods.

In some high power laser systems, the laser diodes operate at power levels up to and exceeding 800 amperes. Also, in some applications the laser diodes may be activated between 10-300 times/sec. At such high current levels and frequency of operation, the laser diodes are very sensitive to current variations. If the applied current overshoots by even a small amount each time the laser diode is activated, it can lead to premature failure of the laser diode due to stress. Since there may be upwards of 500 laser diodes in each array, a high rate of failure of a laser diode may not be acceptable. Techniques disclosed herein provide a more reliable and robust control system for the laser diodes.

FIG. 1 is a block diagram of a laser diode system 100 according to an embodiment of the present invention. System 100 includes a beam control sub-system 102, a signal generator 104, an optical transmitter 106, an optical receiver 108, a laser diode driver 110, and a laser diode 112.

Beam control sub-system 102 is configured to control the parameters for the laser beam outputted by laser diode 112. In some embodiments, beam control sub-system 102 may determine the current to be applied to a laser diode and a duration for which the current pulse is to be applied to the laser diode. In other words, beam control sub-system 102 may determine the output power level of the laser beam outputted by laser diode 112 and the duration for which the laser beam is outputted by laser diode 112. For example, the current applied to laser diode 112 may be about 200 amps and the current pulse duration may be up to 300 microseconds with an interval of up to 60 milliseconds seconds between two successive current pulses. In some embodiments, beam control sub-system 102 may be used to adjust the current and/or pulse width of each individual laser diode 112. This helps to maintain the optical output of the overall diode array at a constant desired level. Ability to control outputs of each laser diode 112 may help in adjusting for diode or diode array degradation over time. In some embodiments, beam control sub-system 102 may communicate the current level and pulse duration information to signal generator 104. In some embodiments, beam control subsystem may include control and processing circuitry that communicates with one or more external systems to determine the power level and the duration.

Signal generator 104 can be implemented using a commonly available optical signal generator, e.g., a field programmable gate array (FPGA) available from Xilinx Inc. A signal generator is an electronic device that generates repeating or non-repeating electronic signals in either an analog or a digital domain. In some embodiments, signal generator 104 can receive the inputs from beam control subsystem 102 and generate an optical signal based on the inputs. For example, signal generator may receive the current level and pulse duration information from beam control sub-system 102, generate an optical signal that encodes the current level and pulse duration information and communicate that optical signal to optical transmitter 106. In some embodiments, signal generator 104 may generate an optical signal that includes bi-phase encoded data. The bi-phase encoded data may include the current level and duration information. In this instance, the optical signal acts as a carrier signal for transmitting the encoded data.

Optical transmitter 106 can be any transmitter that is able to receive an optical signal and transmit that optical signal. In some embodiments, optical transmitter may include an infrared photodiode. In a particular embodiment, an optical transmitter such as e.g., OSRAM SHF420 or SHF425 may be used. However, it is to be noted that other types of optical transmitters may also be used successfully. In some embodiments, signal generator 104 and optical transmitter 106 may be implemented as a single integrated unit.

Optical receiver 108 can be implemented using any conventional optical receiver that is able to receive an optical signal and decode the optical signal to extract the current level and duration information. In some embodiments, optical receiver 108 may include a photo diode coupled to a mixed-signal microcontroller. The photo diode may receive the optical signal and the microcontroller may decode the data included in the optical signal to determine the current level and pulse duration information embedded in the optical signal.

In some embodiments, optical receiver 108 may communicate the current level and pulse duration information to laser diode driver 110. Laser diode driver 110 is used to drive laser diode 112 to generate a laser beam using the current level applied for a desired duration of time. In some embodiments, laser diode driver 110 can receive the current level and pulse duration information from optical receiver 108 and use that information to cause laser diode 112 to generate laser beam that conforms to those parameters. In some embodiments, laser diode driver 110 and optical receiver 108 may be packaged in a single enclosure and be coupled to each other. In other embodiments, optical receiver 108 may be physically attached to laser diode driver 110. In some embodiments, a single laser diode driver may control a single laser diode. In other embodiments, a single laser diode driver may control multiple laser diodes mounted in a laser diode bar. For example, a laser diode bar may include up to 50 laser diodes. The laser diode driver may control multiple diode bars configured as a diode tile. Each tile can have up to 50 diode bars. The laser diode driver may also control multiple diode tiles. A single diode driver may control as many as 15 diode arrays/tiles. In still other embodiments, a single laser diode driver may control an array of laser diodes. Details of a laser diode driver that may be used in embodiments of the present invention are disclosed in commonly-owned and co-pending U.S. patent application Ser. No. 12/813,662, filed on Jun. 11, 2010, the contents of which are incorporated by reference herein in their entirety for all purposes.

Laser diode driver 110 is coupled to a laser diode 112. Laser diode 112 can be implemented using any of the commercially available laser diodes from companies including Northrop Grumman Corp. and nLight Corp, among others. In some embodiments, laser diode 112 receives current from laser diode driver 110 for specific duration, e.g., 50 microseconds, which causes laser diode 112 to output a laser beam based on the input current for the specific duration. This process may be repeated for up to 300 times per second resulting in a pulsed operation of laser diode 112.

Further, while system 100 is described herein with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained. Embodiments of the present invention can be realized in a variety of devices including electronic devices implemented using any combination of circuitry and software.

As described above, each laser diode is coupled to a corresponding laser diode driver that drives the laser diode to output a laser beam. In a conventional system, each laser diode driver would be hard-wired back to the beam control sub-system. In an IFE-type application, there may be up to 1000 laser diode tiles that are "fired" or "turned on" at the same time to provide a certain desired output. As described above, precise control of the timing for firing the laser diodes is important. Also, it is desirable that all the laser diodes output a laser beam with specific power level and for a specified duration. In a system which has such enormous number for laser diodes, there are instances when certain laser diodes "age" in comparison to other laser diodes. As laser diodes age, the light output from them for a fixed current input diminishes over time. Thus, older laser diodes may need to be driven at higher input current levels compared to newer laser diodes in order to achieve the same power output. For instance, consider that laser diode #12 is new and laser diode #456 is an older laser diode that has been operating for a few years. Both laser diodes can be in the same array or a different array. In this instance, more current would be needed to drive laser diode #456 to output a laser beam having certain power than laser diode #12, which would need less current or shorter pulse width compared to laser diode #456 to output a laser beam having the same power level. Thus, the encoded data transmitted to laser diode #456 will have different parameters than the encoded data transmitted to laser diode #12.

In order to ensure that all of the 1000 or so laser diodes output laser beams with the same or substantially same output power level, some laser diodes may need a different current input or pulse width input than others as described above. In order to ensure that each laser diode can be individually controlled, the laser diode driver associated with a laser diode may be assigned a unique address. In some embodiments, the optical signal may include the unique address associated with a laser diode driver. For instance, each laser diode driver may be assigned a unique 10-bit address. The optical signal transmitted may include the 10-bit address for a laser driver along with the current level and pulse duration information. When the optical receiver receives the optical signal, it may extract the address information and provide that to the laser driver. The laser driver may determine whether the extracted address matches its own address. If the extracted address matches the address assigned to the laser diode driver, the laser diode driver can use the current level and pulse duration information from the optical signal to drive the associated laser diode. If the addresses do not match, the laser diode driver can ignore the information in the optical signal. In this manner each individual laser diode can be controlled precisely to output the desired power level.

In addition to outputting the same power level and for the same duration, it is desirable that all the 1000 or so laser diodes fire at the same time thus providing maximum power for the fusion process to start. In order to ensure that all the laser diodes fire at the same time, in some embodiments, the beam control sub-system may send a "fire now" signal to each of the laser diode drivers at the appropriate time. In some embodiments, the laser diodes are operated between 10-300 times per second. Thus, a "fire now" signal may be communicated to the laser diodes between 10-300 times per second. Once the laser diode drivers receive the "fire now" signal, each laser diode driver applies the specified current level for the specified time to its associated laser diode and as a result each laser diode outputs a laser beam based on the parameters received from the laser diode drivers.

In some embodiments, the optical signal communicating the bi-phase encoded data including the current level and the pulse duration information can be sent between two consecutive "fire now" signals. Thus, when the "fire now" signal is received by a laser diode driver, it will have already received the current level and pulse duration information to be used for the associated laser diode. In some embodiments, the output of each laser diode is monitored for every operation cycle and the information fed back to the beam control system and/or the laser diode driver. The beam control subsystem and/or the laser diode driver then determines whether the output of a laser diode needs to be adjusted and by how much to output the desired power level. In some embodiments, only the laser diodes for whom the output needs to be adjusted may receive a signal prior to a "fire now" signal. If no change in output is needed based on the feedback, no signal may be sent to that particular laser diode. In this instance, if a laser diode driver does not receive current level and duration parameters prior to a "fire now" signal, it may use the last received parameters to operate the laser diode. In some embodiments, in order to achieve this, the optical signal includes address information for the concerned laser diode driver along with the new parameters. Thus, only those laser diode drivers whose addresses match the addresses in the optical signal will extract the new parameters. All other laser diode drivers may ignore the information in the optical signal and use the last received parameters for operating their associated laser diodes.

As discussed above, the optical signal is sent to each of the laser diode drivers and the optical signal includes address information for each of the laser diode drivers. In some embodiments, the laser diodes are arranged in an array form where tens of hundreds laser diodes may be coupled together on a common frame and light outputted from the laser diodes may be collimated. In this instance, the optical signal can be used to communicate information to an entire array of laser diodes, where the array of laser diodes may have a single unique address.

Figure 2:
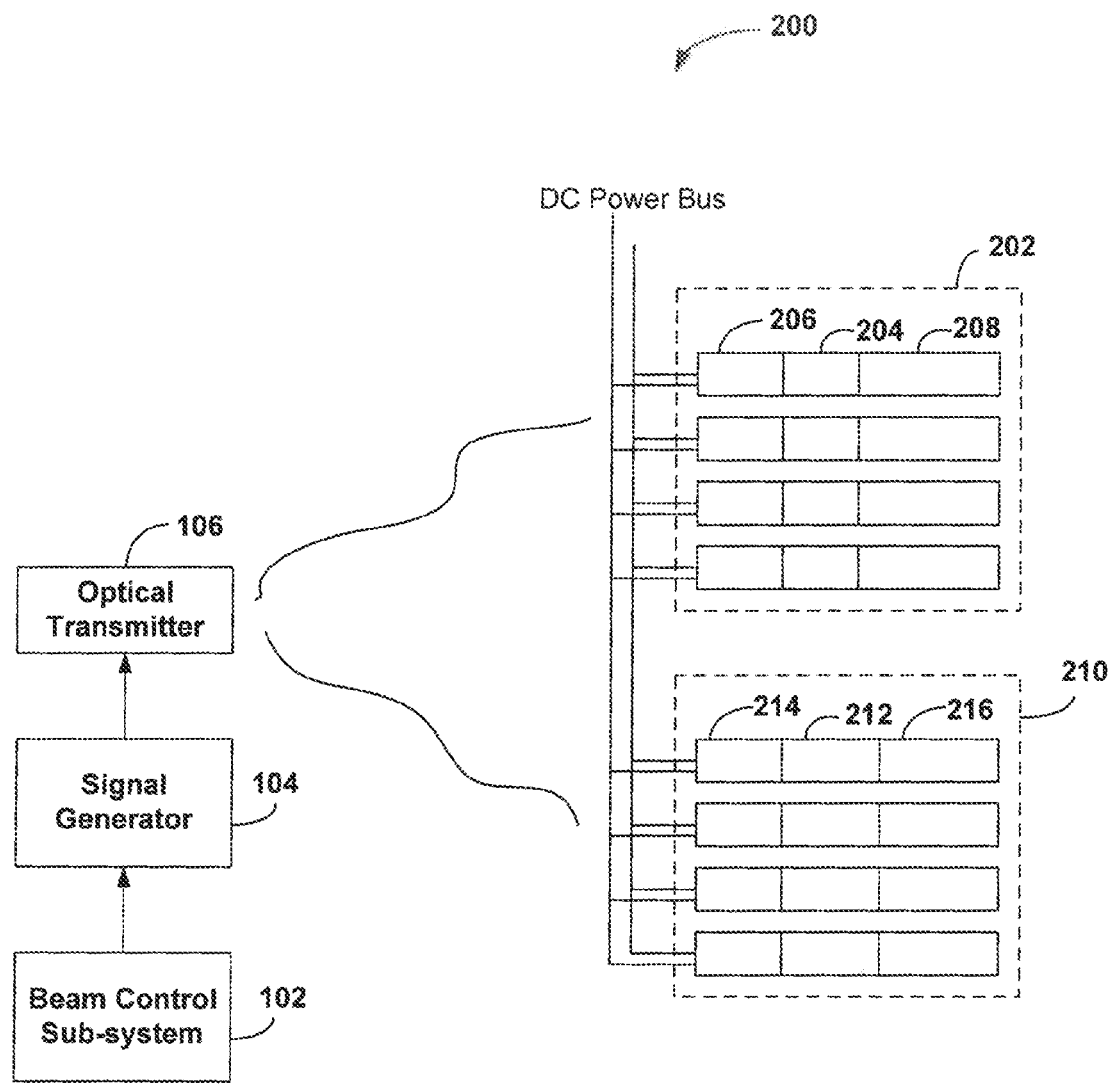
FIG. 2 is block diagram of a system for controlling multiple arrays of laser diodes according to an embodiment of the present invention.

FIG. 2 illustrates system 200 including two arrays of laser diodes. It is to be noted that only two arrays are shown in FIG. 2 for ease of explanation. One skilled in the art will realize that more than two arrays can be included in system 200. Array 202 includes one or more laser diodes 208 and laser diode drivers 204. Each laser diode 208 and laser diode driver 204 is coupled to an optical receiver 206. A second array 210 may also include one or more laser diodes 216 and laser diode drivers 212 and each of laser diodes 216 and laser diode drivers 212 is coupled to an optical receiver 214. In some embodiments, each array 202, 210 may be assigned an address and the laser diode drivers in that array may all respond to that address. In this instance, the optical signal may include current level and pulse duration information for each array instead of each individual laser diode. All laser diode drivers in an array may use the same current level and pulse duration information to drive the laser diodes to generate a laser beam. This may greatly reduce the complexity of the optical signal.

In other embodiments, instead of a single laser diode, element 208 may correspond to a laser diode bar 208. Each laser diode bar 208 may include multiple laser diodes, e.g., 50. In this instance, laser diode driver 204 may drive all the laser diodes in laser diode bar 208. Each laser diode driver 204 may be assigned a unique address. Thus, when the optical signal includes current and duration information for an address associated with laser diode driver 204, it may operate all laser diodes on laser diode bar 208 using that current and duration information.

As described above, the optical signal includes bi-phase encoded data that includes current level and duration information for operating the laser diodes and address information associated with one or more laser diode drivers. FIG. 3 is a table 300 that illustrates a format for the bi-phase data that can be communicated using the optical signal according to an embodiment of the present invention. Table 300 illustrates a data length field 302 that indicates the number of bits used to represent the type of data and payload field 304 indicates the corresponding data payload for the number of bits. As can be seen from table 300, the optical signal can include up to 80 bits of data (10 bytes). It is to be noted that table 300 is for illustration purposes only and as one skilled in the art will realize, the encoded data may have many other formats with varying bit lengths for individual information.

From the 80 or so bits, up to 16 bits can be used to indicate the Frame Sync information. A Frame sync pattern is a pattern that appears at the beginning of each date frame that is transmitted. As described above, each laser diode driver can be assigned a unique address. In some embodiments, up to 10 bits can be allocated to the address for each of the laser diode drivers. This may provide the ability to address more than 1000 ($2^{10}$) laser diode driver devices. The address field can be increased to 12 or 16-bits based on the number of individual laser diode driver devices to be addressed. In some embodiments, up to 10 bits may be used to convey the current level information, which may correspond to the input current to be applied to the laser diode. In some embodiments, the current level can range between 1 and 550 Amps. In some embodiments, the current levels can be increased in increments of 1 amp, although other increment intervals may also be used.

In some embodiments, up to 9 bits may be used to indicate the pulse duration or width, which may correspond to the duration for which the laser diodes are to be turned on at a time. In some embodiments, the range of the pulse duration is between 1 μs and 300 μs and may be increased in increments of 1 μs. One skilled in the art will realize that other increment intervals are possible. In some embodiments, 1 bit may be used to communicate the "fire now" command to the laser diodes. For example, a "1" for that bit may indicate that the laser diodes may output a laser beam immediately upon receipt of the command. In addition, up to 16 bits can be used to perform error checking such as cyclic redundancy check (CRC). Any unused bits from the available 80 bits can be used to increase the range for any of the parameters such as current level, address information, etc. For example, additional bits may be added to expand the addressing capability from about 1000 devices to even more devices.

It is to be noted that table 300 is for illustration purposes only and the data format illustrated in table 300 on only exemplary. One skilled in the art will realize that other data formats may be used, e.g., wherein each individual data type being assigned more or less bits than shown in table 300.

Figure 4:
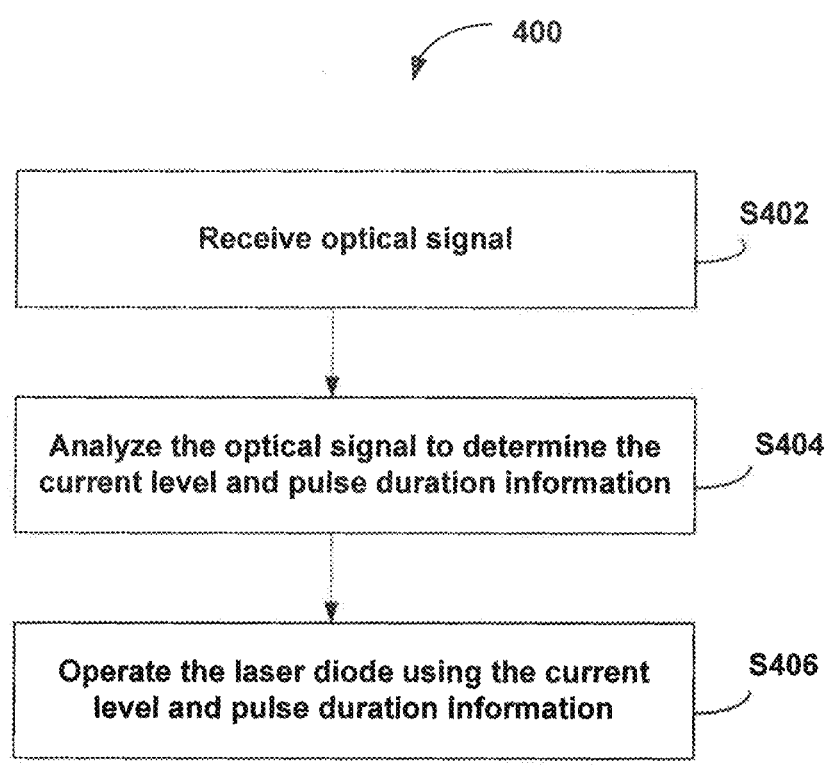
FIG. 4 is a flow diagram of a process for controlling a laser diode according to an embodiment of the present invention.

As described above, an optical signal may include bi-phase encoded data that is used to drive the laser diodes to provide a laser beam with a certain power level for a certain duration. FIG. 4 is a flow diagram of a process 400 for operating laser diode according to an embodiment of the present invention. Process 400 can be performed by a laser diode driver, e.g., laser diode driver 110 of FIG. 1, in conjunction with an optical receiver.

The laser diode driver can receive an optical signal captured by the optical receiver (Step 402). As described above, the optical signal may include bi-phase encoded data. Once the optical signal is received, the laser diode driver can analyze the optical signal to determine the current value and pulse width (duration) information included in the bi-phase encoded data (Step 404). Once the current value and the duration information is determined from the optical signal, the laser diode driver can operate the laser diode by providing the current specified in the optical signal and for the time as specified by the duration information (Step 406). As a result, the laser diode then outputs a laser beam based on the applied current and for duration substantially equal to the duration for which the current pulse is applied.

It should be appreciated that the specific steps illustrated in FIG. 4 provide a particular method of operating a laser diode according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

As described above, the laser diodes may be arranged in an array. In this instance, process 400 can be used to control each of the laser diodes in the array. In some embodiments, each array may be given a unique address in addition to the address for each of the laser diode drivers. In this instance, the optical signal may also include the array address in addition to the address for the laser diode driver.

In some embodiments, the bi-phase encoded data in the optical signal can also include a clock signal derived from a reference clock. The clock signal can be used to keep all the laser diode drivers in synchronization. In some embodiments, the clock signal may be a 155 MHz signal. Keeping the clocks for all the laser diode drivers ensures that they can all fire at the same time, which is desirable in an IFE-type power plant system.

In some embodiments, the laser diodes may be non-linear low impedance loads. In such an instance, the response of the circuit that includes the beam control sub-system, the laser diode driver, and the laser diode itself may depend on inductance of the circuit and non-linearity in the laser diode load. The impedance of the laser diode load is small (e.g., in milliohms), and hence even small amounts of loop inductance combined with the laser diode's non-linearity can significantly affect the rise and fall times of the circuit. In particular, circuit time constants, which are dominated by the ratio of inductance to resistance, can cause laser diode currents to lag significantly behind the control system demands. If the control system demands a faster change in current than what the driver circuit can accommodate, it can result in the control loop saturating and temporarily losing control of the output current, which can manifest itself as either as an overshoot and/or undershoot of the current compared to the desired wave shape.

Figure 5:
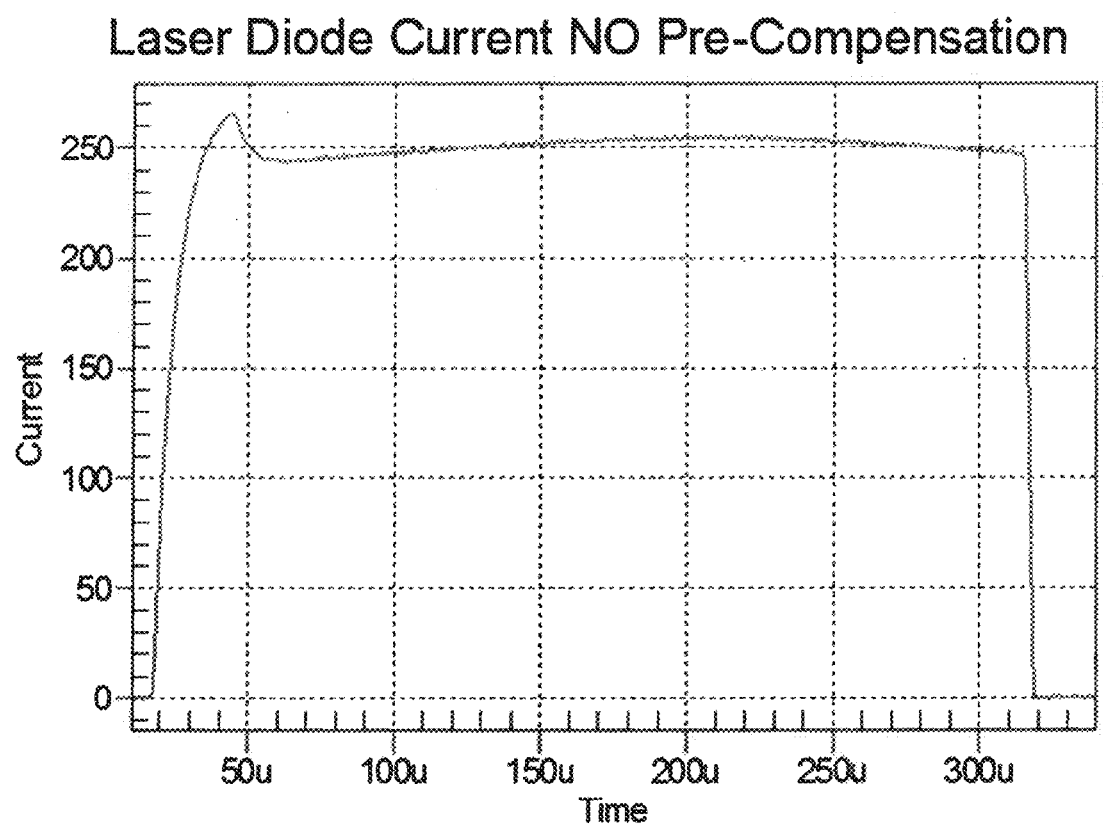
FIG. 5 is a graph illustrating current flow through a laser diode that is not operated using the embodiments of the present invention.

FIG. 5 is a graph illustrating actual current flowing in a laser diode when the techniques described herein are not implemented. As illustrated in FIG. 5, the nominal set point for the current is about 250 A. As can be seen, once the drive signal is applied to the laser diode driver and the laser diode driver operates the laser diode, there is a significant overshoot of the current within the laser diode followed by an undershoot. For a current pulse that is about 300-315 μs in duration, the current in the laser diode is not constant at the set point.

Techniques described below can improve the performance of the laser diode driver circuit by preconditioning the analog gate drive signal applied to the driver's control loop. This can be accomplished using an Arbitrary Waveform Generator (AWG) in the laser diode driver circuit to improve the performance of the laser diode driver. In particular, the AWG can tailor the leading and trailing edges of the pulse current delivered to the laser diode. The duration of the pulse as well as the overall pulse amplitude are set by the AWG pursuant to digital input signals provided by the beam control subsystem. The beam control subsystem may be an optical communication system as described above. In a particular embodiment, an optical transmitter may be coupled to the laser diode driver circuit associated with each laser diode or an array of laser diodes for transmitting an optical signal including bi-phase encoded data. The optical signal includes current level and pulse duration information at which each of the diodes is to be driven. Upon receiving a trigger signal, the AWG in the laser diode driver circuit operates the laser diodes using the current level and pulse duration information to output a laser beam.

As described above, circuit response is dominated by the inductance of the loop and non-linearity in the laser diode. The AWG in the laser diode driver circuit can be used to keep these parameters in a range and prevent the control loop from saturating. In other embodiments, the non-linear characteristics of the laser diode may limit response of the circuit. The AWG input to the main control loop can be adjusted to compensate for these effects and produce a more desirable rectangular current pulse.

Figure 6:
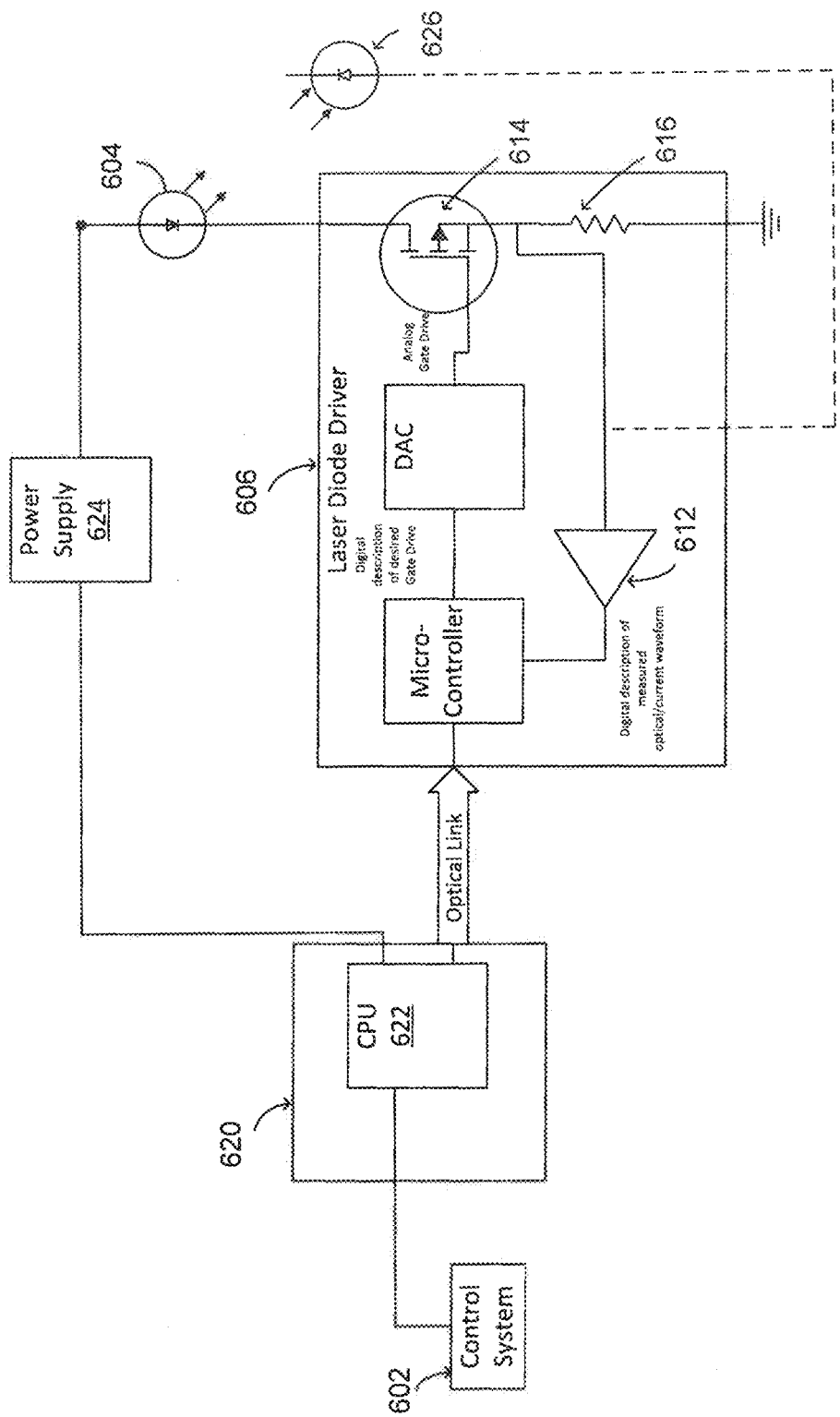
FIG. 6 is a block diagram of a circuit for operating a laser diode according to an embodiment of the present invention.

FIG. 6 is a functional block diagram of a circuit for operating a laser diode according to an embodiment of the present invention. As illustrated in FIG. 6, a control system 602 (e.g., similar to beam control subsystem 102 of FIG. 1) outputs a signal that includes the desired current value for laser diode 604. The signal may be in the form of an optical signal as described above and may include bi-phase encoded data that includes the current value and the duration for which the current is to be applied to laser diode 604. The output of control system 602 is provided to real time controller circuitry 620 that includes a CPU 622, among other components. CPU 622 can perform mathematical computations to output a digital signal that represents the desired current pulse information. In an embodiment, real time controller circuitry 620 may include a signal generator (not shown) similar to signal generator 104 of FIG. 1 above. Real time controller circuitry 620 can communicate with one or more laser driver units 606 concurrently using an optical link. Laser driver unit 606 includes a microcontroller 608; a digital-to-analog convertor (DAC) 610, an analog-to-digital convertor (ADC) 612, a current sensing resistor 616, and a transistor switch 614. ADC 612 is positioned within the feedback loop of the circuit. Power supply 624 powers laser diode 604. In some embodiments, real-time controller 620 may control power supply 624.

Control system 602 sends a digital description of the desired output current wave shape to real-time controller 620. Real-time controller 620 then sends this information to one or more laser diode driver units 606. Laser diode driver unit 606 produces a corresponding analog gate drive signal and provides that signal to laser diode 604 via the switch 614. Current viewing resistor 616 senses the actual current flowing in laser diode 604 and produces an analog feedback signal and provides the feedback signal to ADC 612. ADC 612 converts the analog feedback signal to a digital signal and sends it to microcontroller 608. Microcontroller 608 compares the feedback signal to the original wave shape requested by control system 602. Micro-controller 608 computes a new digital description of the desired gate drive signal based on the difference. DAC 610 receives the new digital signal as input and produces a new analog gate drive signal which is applied to laser diode 604. This process may be repeated several times and the system may adjust itself to reproduce the desired wave shape. Microcontroller 608, DAC 610, and ADC 612 together form the Arbitrary Waveform Generator (AWG) circuit that compares the actual and desired current pulse waveforms to generate a modified analog current pulse signal to drive laser diode 604. In this manner, current delivered to laser diode 604 is regulated by an analog current feedback system in which the AWG provides digital inputs to this control loop. Microcontroller 608 may have on-board memory that stores instructions for computing the new digital signal by comparing the input received from control system 602 and the measured input received from ADC 612. An example of firmware code/instructions that may be used to compare and generate modified current pulse is illustrated in FIG. 16.

In some embodiments, resistor 616 may be replaced by a photodiode 626 that can capture the optical output from laser diode 604. Photodiode 626 can then generate a signal corresponding to the captured optical/light output and communicate the signal to ADC 612. The signal can then be used to determine the actual current flowing in laser diode 604. In other words, the system can determine a current flowing through laser diode 604 based on the light captured by photodiode 626. The rest of the system can operate as described above. This alternate embodiment is shown by dotted lines in FIG. 6.

Further, while the circuit for operating a laser diode is described in FIG. 6 with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry. Embodiments of the present invention can be realized in a variety of apparatus including devices implemented using any combination of circuitry and software.

Figure 7:
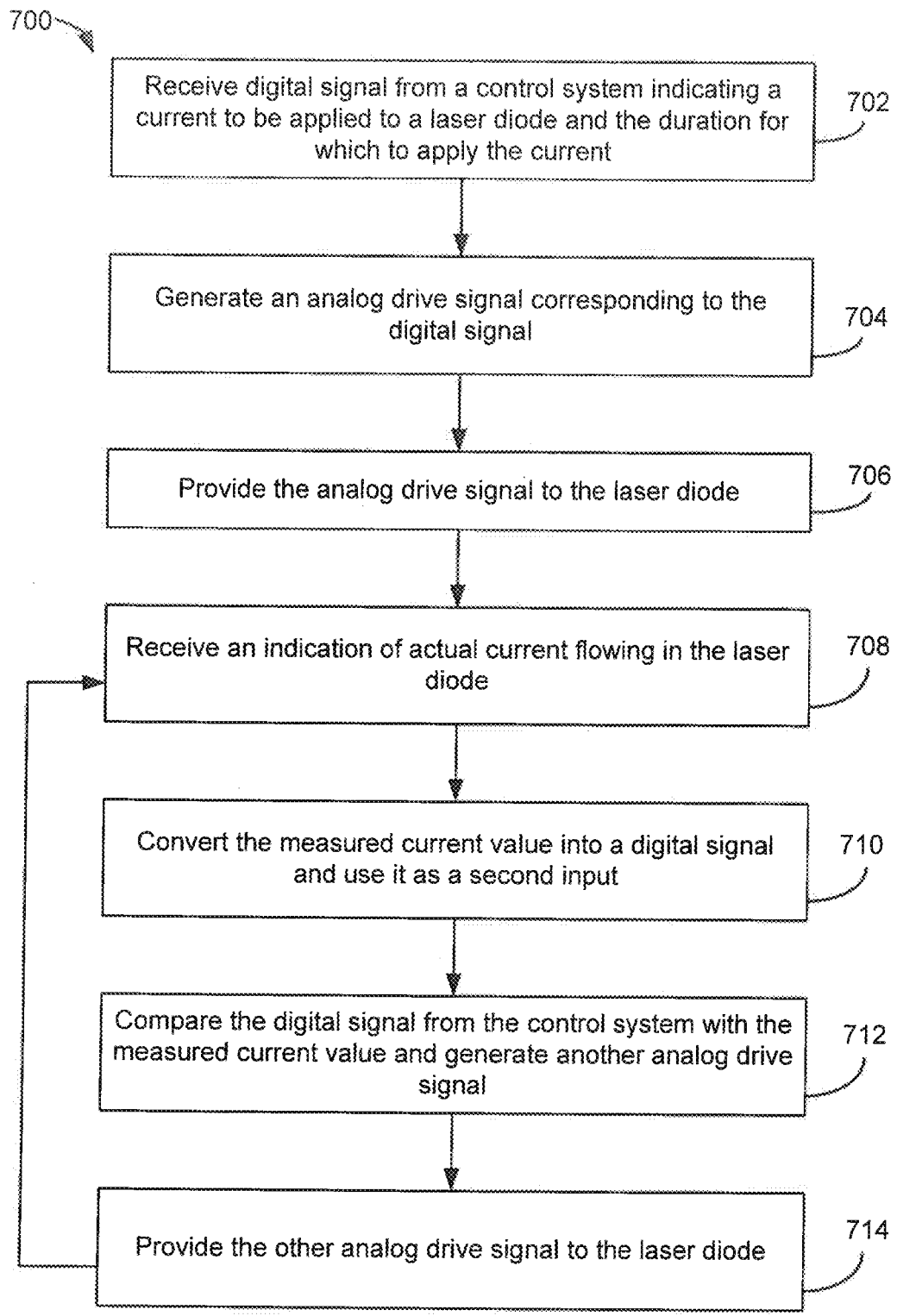
FIG. 7 is a flow diagram of a process for operating a laser diode according to an embodiment of the present invention.

FIG. 7 is a flow diagram of a process 700 for controlling a laser diode according to an embodiment of the present invention. Process 700 can be performed, e.g., by a laser diode driver that includes an AWG as described above.

At step 702, a microcontroller of the laser diode driver can receive a signal from a control system. The signal may be in the form of digital information that includes values for amplitude and duration of a current pulse to be applied to a laser diode. In some embodiments, the amplitude is indicative of a current value to be applied to the laser diode coupled to the laser diode driver and duration may indicate the amount of time for which the current is to be applied. In some embodiments, the input signal may be an optical signal. At step 704, the microcontroller in conjunction with a DAC of the laser diode driver generates an analog drive signal for driving the laser diode based on the input signal. In one embodiment, the microcontroller in conjunction with the DAC may extract the current value and duration information from the input signal and generate a corresponding analog signal. At step 706, the analog drive signal is provided to the laser diode. At step 708, actual current flowing in the laser diode is measured and provided to the laser diode driver. In some embodiments, the actual measured current may or may not be equal to the current value applied to the laser diode. The measured current is then converted into a corresponding digital signal and provided as a second input to the microcontroller of the laser diode driver at step 710.

Thereafter, at step 712, the microcontroller compares the actual measured current and the desired current received from the control system and in conjunction with the DAC generates a second analog drive signal to be applied to the laser diode. At step 714, the second analog drive signal is applied to the laser diode. This process may be repeated until the actual measured current flowing in the laser diode is equal to or substantially equal to the desired current value received from the control system.

It should be appreciated that the specific steps illustrated in FIG. 7 provide a particular method of operating a laser diode according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
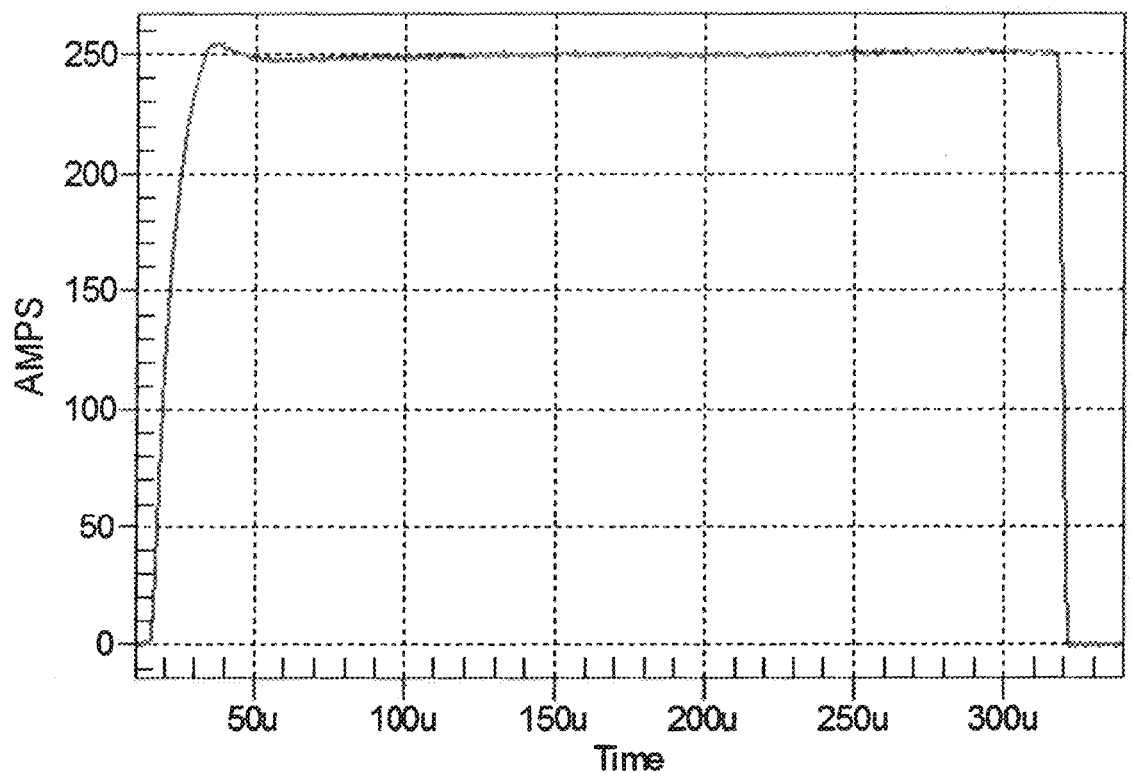
FIG. 8 is a graph illustrating current flow through a laser diode that is operated using the embodiments of the present invention.

FIG. 8 illustrates the actual measured current in the laser diode when the AWG pre-compensation, as described above is used, according to an embodiment of the present invention.

As is evident from FIG. 8, the overshoot/undershoot is significantly reduced giving a much "flat-top" curve that stays substantially at about the set point (e.g., 250 A in this case) throughout the duration of the pulse.

As described above, using the techniques described herein significantly reduces the stress on the laser diode and compensates for the circuit inductances and non-linearity. Laser diodes are fragile loads when operated close to their maximum rated currents. Even short duration transients can cause damage to the diodes. In many applications a "flat top" waveform (one that is well regulated about its set point) is desired. Use of an AWG, as described above, can improve current pulse fidelity as well as protect the laser diodes from damage.

As illustrated in FIG. 5, in conventional systems, when a current of 250 Amps (nominal set point) is to be applied to the laser diode, the current signal may overshoot by about 6-10% before settling down close to the set point. Since the laser diodes are very sensitive at these currents even a small overshoot as illustrated in FIG. 5 can damage the laser diode and significantly reduce its life.

Figure 9:
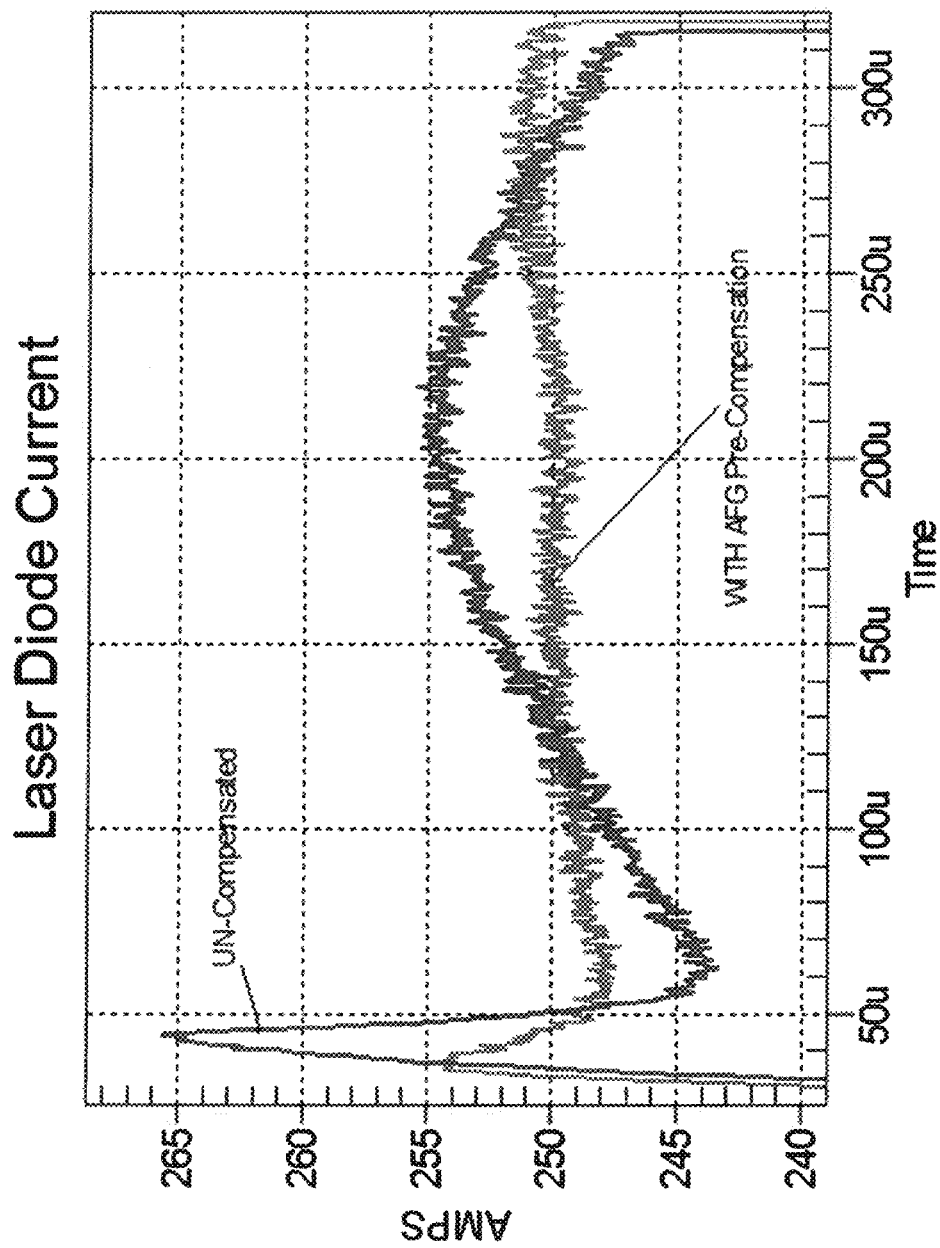
FIG. 9 illustrates a comparison of current flow between a conventionally operated laser diode and a laser diode operated using techniques according to embodiments of the present invention.

FIG. 9 illustrates a zoomed portion showing details of the overshoot when the un-compensated and pre-compensated current profiles are overlaid on each other, according to an embodiment of the present invention. In a particular embodiment, the AWG Pre-Compensated signal shows significant improvement in regulation and greatly decreased over/under shoot. In a particular embodiment, overshoot is reduced from about +6.4% to less than +1.6%, a four times improvement. Undershoot is reduced by a factor of 3.25, from about −2.6% to about −0.8%. The total error in regulation of the compensated system is improved by a factor of about 3.8 over the un-compensated circuit. In this instacne the error is equal to the integral from 35 µs to 315 µs of the absolute value difference between the measured output current and the requested current (i.e. 250 A).

Figure 10:
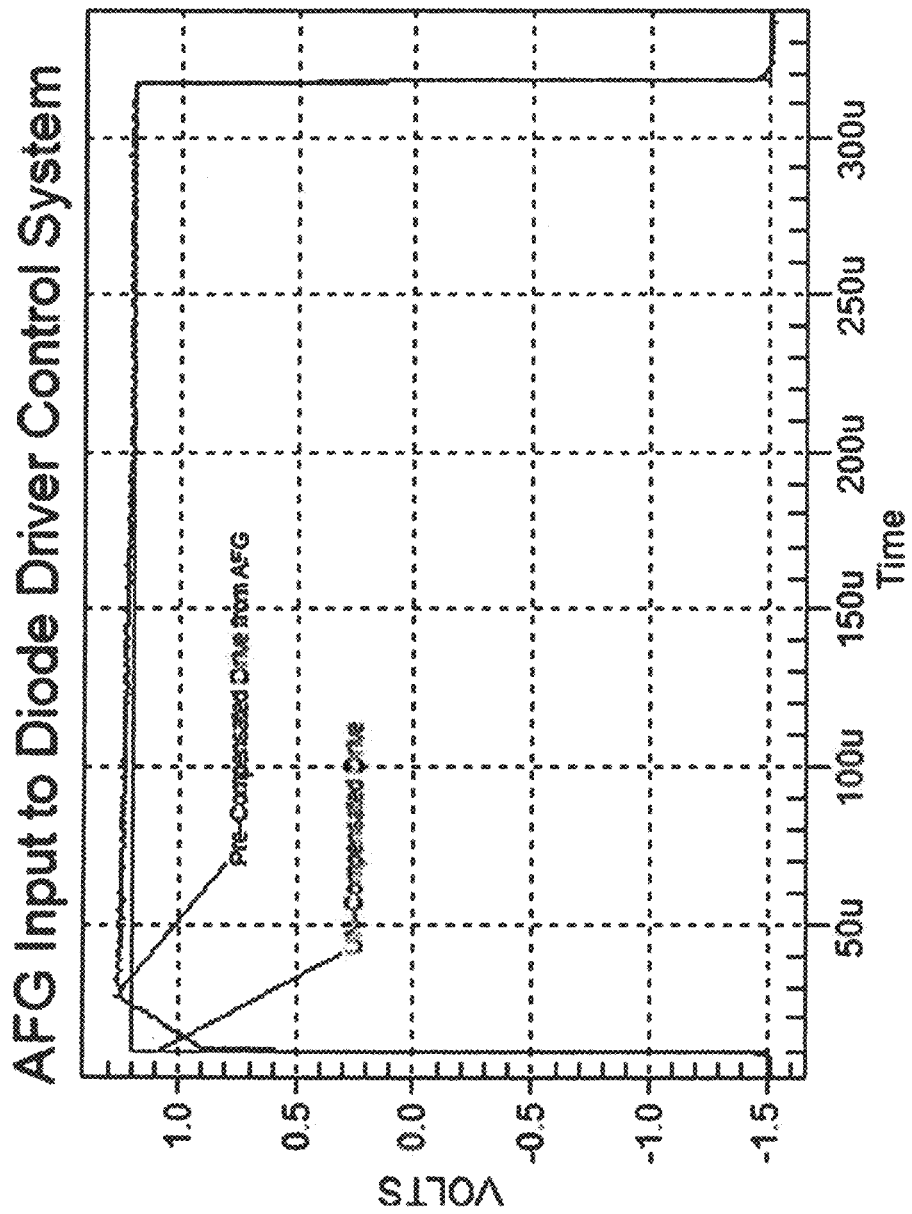
FIG. 10 illustrates comparison of a conventional drive signal and a drive signal outputted by circuitry illustrated in FIG. 6 and/or FIG. 12, according to an embodiment of the present invention.
Figure 11:
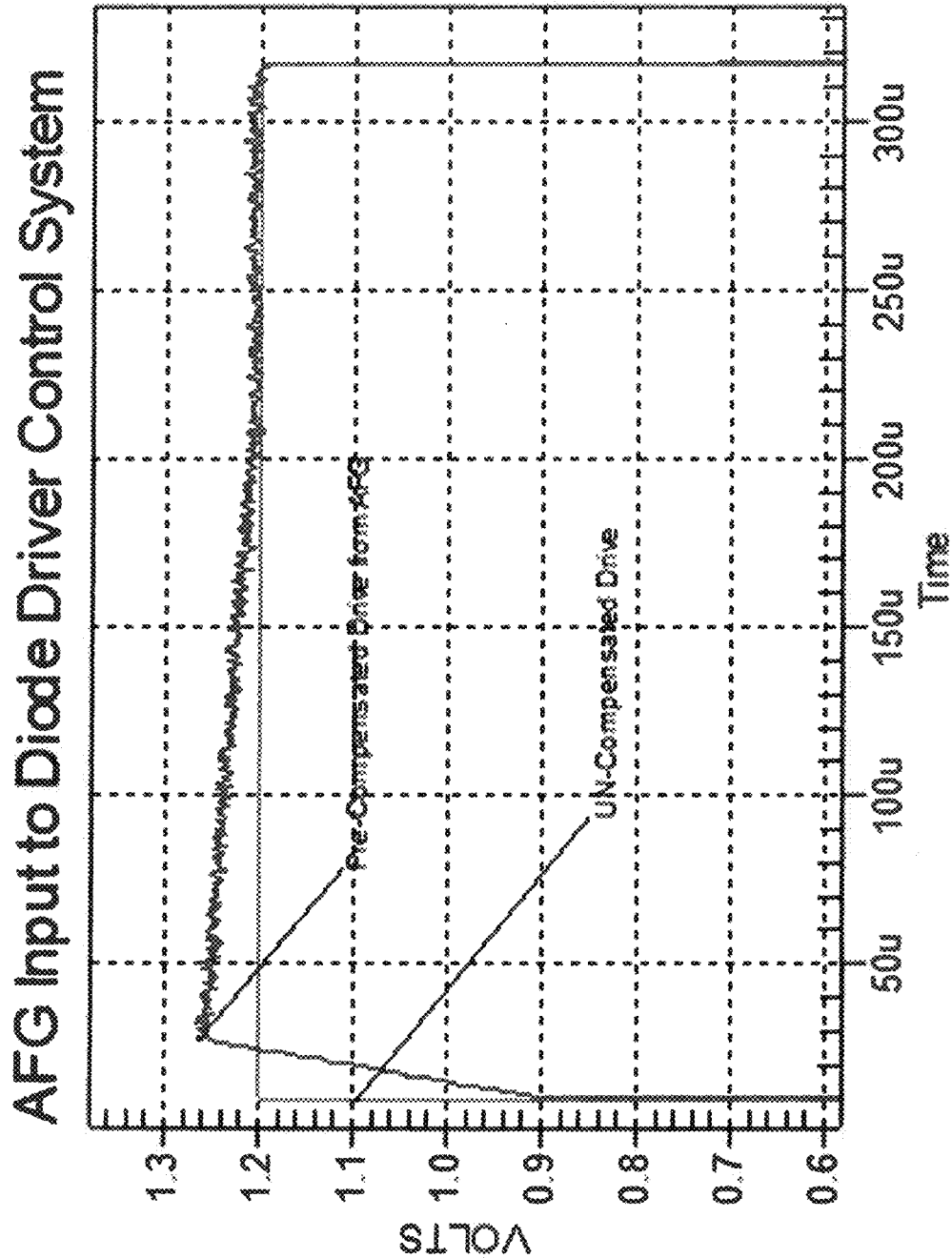
FIG. 11 shows details of a portion of drive signals illustrated in FIG. 10.

In order to get the desired current flow results (e.g., as illustrated in FIG. 8) in the laser diode, the incoming current pulse information from the control system is modified by the AWG as described above. FIG. 10 is a graph illustrating the difference between a rectangular analog drive signal and a pre-compensated drive signal outputted by the AWG according to an embodiment of the present invention. FIG. 11 shows the details around a top portion of the graph in FIG. 10. As can be seen in FIGS. 10 and 11 the uncompensated analog drive signal is essentially a rectangular pulse. However, the analog drive signal that is outputted by the AWG based on the techniques described above has a certain slope at the top left corner as the full voltage is applied to the laser diode driver. In other words, the rate of rise of the voltage in the pre-compensated analog drive signal is slower/more gradual than the uncompensated signal. Applying the pre-compensated signal of FIG. 10 to the laser diode driver results in the current in the diode following the curve illustrated in FIG. 8 instead of the curve illustrated in FIG. 6.

In one embodiment, the microcontroller in the AWG is programmed to step up the voltage of the analog drive signal in a controlled manner using a number of waypoints along the signal. Based on the granularity of control desired, the number of waypoints can be increased or decreased, with more waypoints providing finer control of the curve and vice versa. Having more finer control of the curve may increase the storage capacity requirement for the on-board memory of the microcontroller as more data needs to be stored by the microcontroller in order to have a finer control on the current being applied. This may increase the complexity/cost of the system. A balance between the degree of control and cost can be achieved for any given application of this system.

Figure 12:
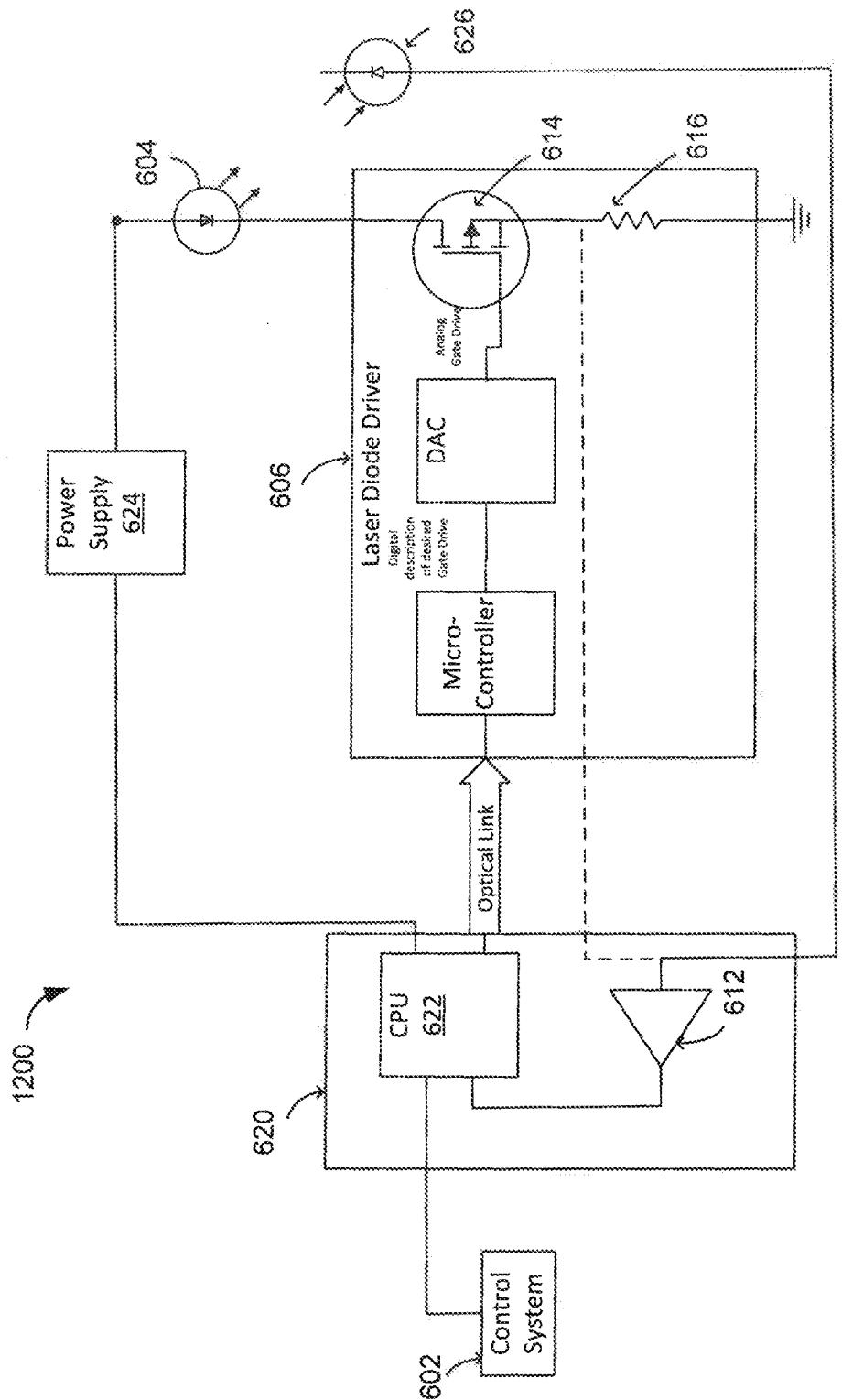
FIG. 12 is a block diagram of a circuit for operating a laser diode according to another embodiment of the present invention.

FIG. 12 is a functional block diagram of a system 1200 for operating a laser diode according to another embodiment of the present invention. The difference between this embodiment and the embodiment described in FIG. 6 is that the feedback from photodiode 626 or resistor 616 is fed back to ADC 612 that is now part of real-time controller 620. Thus, in this embodiment, real-time controller 620 performs the comparison of measured signal and the desired signal and outputs a modified digital signal to laser diode driver 606. The rest of the system 1200 operates substantially similar to the embodiment of FIG. 6. One of the main advantages of this embodiment is that since a single real-time controller 620 can communicate with several laser diode drivers, shifting the computation of comparing and generating the corrected current pulse, based on the feedback, to the real-time controller greatly simplifies the design and complexity of the laser diode driver. Also, this may result in lower cost for the overall system since not every laser diode driver needs to have the ADC as compared to the embodiment of FIG. 6. However, the embodiment of FIG. 6 offers an advantage of faster response time for correcting/modifying the input signal to the laser diode since the correction is done at the local level rather than at the real-time controller. Thus, both the embodiment of FIG. 6 and the embodiment of FIG. 12 offer certain advantages over each other and the choice of which embodiment to implement may depend on the specific system application and between desire for faster response times vs. cost/complexity. In some embodiments, current sensing resistor 616 may be used to measure the actual current flow in laser diode 604 and provide the feedback signal to real-time controller 620.

Although the above embodiments are described using a single laser diode as an example, it is to be understood that in practice the single laser diode may be replaced with a laser diode array that includes several laser diodes (e.g., up to 1000 laser diodes). The techniques described herein are equally applicable to the scenario where a laser diode array is controlled.

Figure 13:
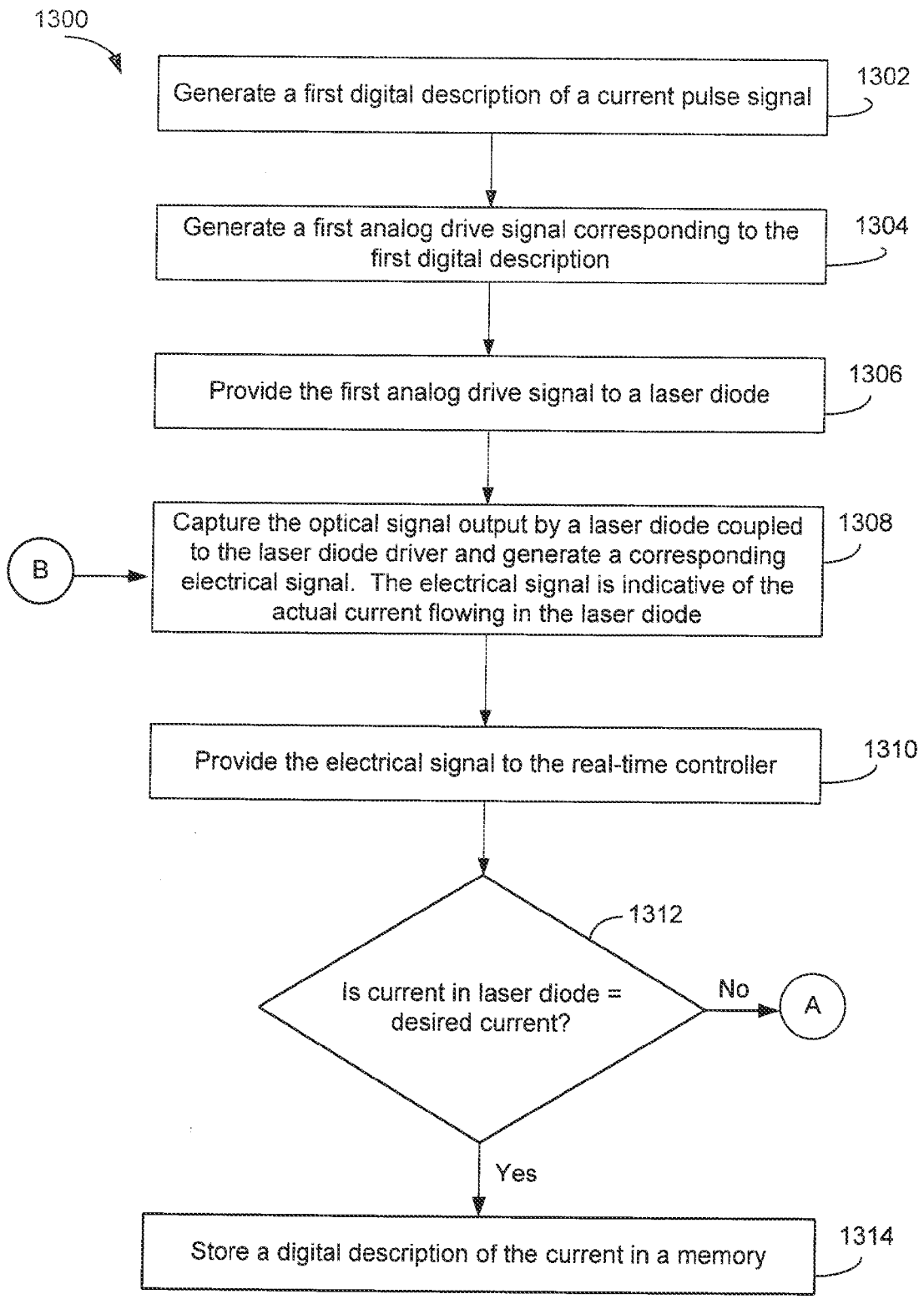
FIG. 13 is a flow diagram of a process for operating a laser diode according to another embodiment of the present invention.

FIG. 13 is a high-level flow diagram of a process 1300 for operating a laser diode according to an embodiment of the present invention. Initially control system 602 may output, to a real-time controller, a digital description of a current pulse to be applied to laser diode 604 (step 1302). The real-time controller can output the received signal to one or more laser diode drivers. A microcontroller along with DAC (both in the laser diode driver circuit) can generate a corresponding analog drive signal to be provided to a laser diode via a switch circuit (step 1304). The generated analog drive signal is then provided to the laser diode (step 1306). Once that current pulse is applied to the laser diode, it may emit an optical signal (e.g., laser light). This optical signal can be captured by an optical device such as a photodiode (step 1308). The photodiode can generate an output electrical signal based on the captured optical signal. The output signal can be indicative of the actual current flowing in the laser diode. The output signal from the photodiode can be provided to the real-time controller unit (step 1310). In the real-time controller unit, the actual current flowing in the laser diode is compared to the desired current value that is included in the first digital description (step 1312). If the actual measured current flowing in the laser diode is equal to or substantially equal to the desired current value, then a digital description of the current pulse can be stored in a memory for subsequent use (step 1314). In a particular embodiment, the memory may be an on-board memory within a CPU of the real-time controller unit.

If at step 1312 it is determined that the actual current is not equal to or not substantially equal to the desired current, the real-time controller can generate a second digital description of the desired current pulse based on the information received from the photodiode and the first digital description (step 1316) and provides that signal to one or more laser diode driver circuits, e.g., via the optical link. Thereafter, a second analog drive signal is generated based on the second digital description of the current pulse (step 1318). The second analog drive signal is then provided to the laser driver (step 1320). Thereafter, the process returns to step 1308. This process may be repeated several times until a final digital description of the current pulse is generated. This can be referred to as the "learning" phase of the system. From then on whenever the laser diode needs to be activated, the stored digital description can be recalled from the memory and converted to the corresponding analog drive signal and provided to the laser diode driver.

In some embodiments, the photodiode may be disabled after completion of the "learning" phase and no further feedback is provided to the control system. The photodiode may be periodically activated to run checks and/or to recalibrate the system, e.g., when any component of the system is changed such as the cables, the laser diode, and/or the laser diode driver. Although a photodiode is used in the description above, one skilled in the art will realize that any device that can capture optical signal and convert it to a corresponding electrical signal similar to the photodiode can also be used.

It should be appreciated that the specific steps illustrated in FIG. 13 provide a particular method of operating a laser diode according to an embodiment of the present invention. Other sequences of steps may also be performed according to alternative embodiments. For example, alternative embodiments of the present invention may perform the steps outlined above in a different order. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 14:
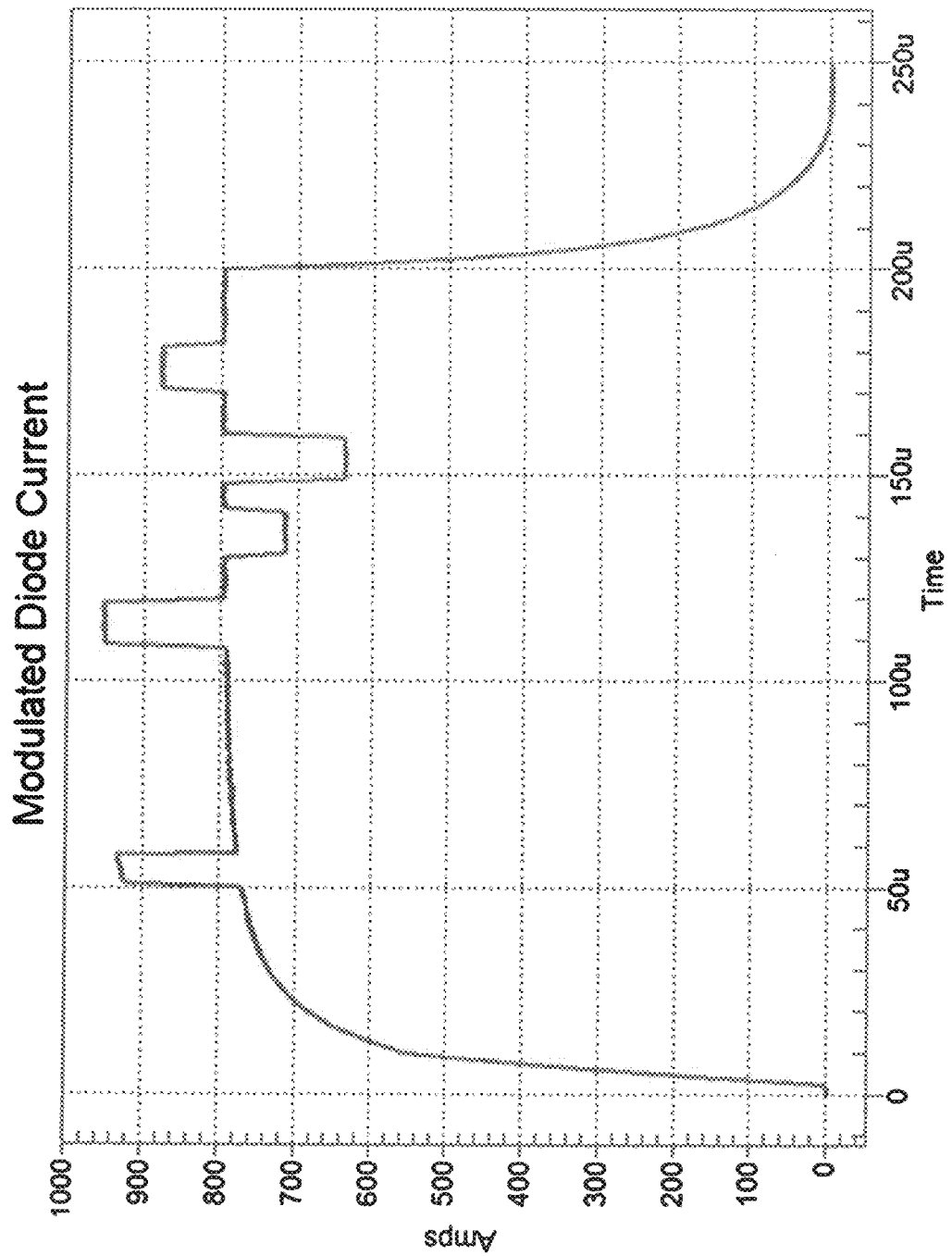
FIG. 14 illustrates a dynamically varying current pulse over time flowing through a laser diode according to an embodiment of the present invention.

FIG. 14 illustrates a modulated diode current flowing through a laser diode according to an embodiment of the present invention. As illustrated in FIG. 14, embodiments of the present invention provide the ability to dynamically vary the current flowing through the laser diode over a period of time. As can be seen, FIG. 14 presents a very complex pattern of diode current values being measured over a period of about 250 μs. Using the techniques disclosed herein, it is possible to dynamically vary the current flowing through the laser diode over any given period of time. Also, the techniques disclosed herein allow a very granular control of current in small increments of time, e.g., in the microsecond range. For example, as seen in FIG. 14, the current flowing through the laser diode is continuously varied with the span of about 250 μs. Using techniques disclosed herein a current pulse having any arbitrary shape can be controlled. Further, the techniques disclosed herein allow for dynamic variation and control of current being applied to a laser diode. Thus, depending on the application and desired output from a laser diode, the input to the laser diode can be varied dynamically using the laser driver circuit and the arbitrary waveform generator described above.

Several advantages can be recognized by using the techniques described herein. For example, using the embodiments described above, overshoot of laser diode current can be avoided by having a better control of the leading edge current. Such overshoots of laser diode currents can significantly damage the laser diode, especially in applications where the laser diode is activated up to 15 times/second. When techniques described above are used to control arrays of laser diodes, each circuit in the array adjusts itself to make up for the differences in the circuits. An example of circuit differences may be varying cable lengths, which introduce different inductances/resistances for each circuit in the array. In the absence of the techniques described above, each circuit in such an array would have to be tuned individually. In some embodiments, the wave shape can be easily adjusted to adjust for factors such as a reduction in laser output due to diode aging and/or non-linear diode responses. One way to do this may be to introduce a "slope" to the diode current to produce a more uniform laser output with time.

In some embodiments, the system may also be operated "open loop", in which case the analog feedback is used and the AWG in the laser diode driver circuit provides a "pre-emphasis" to produce the desired waveform. In this open loop scenario, the original waveforms may be distorted to make up for known performance issues in the laser diode. This "pre-emphasis" can also be accomplished with standard analog feedback techniques, but the digital control allows the operator to make changes without having to make physical changes to the circuit.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

What is claimed is:

1. A method comprising:
   receiving, by a control circuit, a digital description of a current pulse, the digital description including information about a current value and a duration for which the current value is to be applied to a laser diode;
   generating, by the control circuit, an analog drive signal corresponding to the digital description of the current pulse;
   communicating, by the control circuit, the analog drive signal to the laser diode;
   receiving, by the control circuit, information indicative of current flow through the laser diode upon application of the analog drive signal;
   generating, by the control circuit, a new digital description of the current pulse based on the digital description of the current pulse and the information indicative of the current flow through the laser diode, wherein generating the new digital description of the current pulse comprises:
      comparing, by the control circuit, the current flowing through the laser diode to the current value included in the first digital information;
      determining, by the control circuit, that the current flowing through the laser diode is not substantially equal to the current value included in the first digital information; and
      generating, by the control circuit, the new digital description of the current pulse based on the determination;
   generating, by the control circuit, a new analog drive signal corresponding to the new digital description of the current pulse; and providing, by the control circuit, the new analog drive signal to the laser diode.

2. The method of claim 1 wherein the control circuit comprises an arbitrary waveform generator.

3. The method of claim 1 wherein the control circuit comprises a microcontroller, a digital-to-analog converter, and an analog-to-digital converter.

4. The method of claim 1 further comprising storing the new digital description of the current pulse on a memory unit included in the control circuit.

5. The method of claim 1 wherein receiving the information indicative of current flow through the laser diode upon application of the analog drive signal further includes receiving the information from a current sensing device coupled to the laser diode.

6. The method of claim 5 wherein the current sensing device is a resistor.

7. The method of claim 5 wherein receiving the information from the current sensing device comprises receiving a signal from a photodiode, the signal corresponding to light output from the laser diode that is captured by the photodiode.

8. The method of claim 2 wherein the new analog drive signal is characterized by a slope that compensates for laser non-linearities.

9. A method comprising:
receiving, by a controller, first digital information indicating a current pulse to be applied to a laser diode, the current pulse having an amplitude and duration, wherein the amplitude is indicative of a current value and the duration is indicative of a time period for which the current value is to be applied to the laser diode;
providing, by the controller, the first digital information to a laser diode driver coupled to the controller, the first digital information being used to generate a corresponding first analog drive signal for the laser diode;
receiving, by the controller, a signal from a current sensing device, the signal indicative of actual current flowing through the laser diode upon application of the analog drive signal;
generating, by the controller, second digital information indicating a new current pulse to be applied to the laser diode, the second digital information being based on the first digital information and actual current flowing through the laser diode, wherein generating the second digital information further comprises:
comparing, by the controller, the actual current flowing through the laser diode to the current value included in the first digital information;
determining, by the controller, that the actual current flowing through the laser diode is not substantially equal to the current value included in the first digital information; and
generating, by the controller, the second digital information based on the determination; and
providing, by the controller, the second digital information to the laser diode driver.

10. The method of claim 9 further comprising storing the second digital information in a memory device included in the controller.

11. The method of claim 9 wherein the current sensing device is a resistor.

12. The method of claim 9 wherein receiving the signal indicative of actual current flowing through the laser diode further comprising receiving a signal from a photodiode, the signal being generated based on light output from the laser diode that is captured by the photodiode.

13. The method of claim 9 wherein the controller comprises an optical receiver and receiving the first digital information comprises receiving an optical signal.

14. The method of claim 9 wherein the second digital information is communicated as an optical signal to the laser diode driver.

15. The method of claim 9 further comprising generating the first digital information using a beam control system.

16. The method of claim 9 wherein the second digital information is characterized by a wave shape that compensates for non-linear diode responses.

17. A system comprising:
a control circuit;
a laser diode driver circuit coupled to the control circuit;
a laser diode coupled to the laser diode driver circuit; and
a current measuring device coupled to the laser diode, the current measuring device being configured to measure current flow through the laser diode;
wherein the control circuit is configured to:
receive first digital information indicating a current pulse to be applied to a laser diode, the current pulse having an amplitude and duration, wherein the amplitude is indicative of a current value and the duration is indicative of a time period for which the current value is to be applied to the laser diode;
provide the first digital information to the laser diode driver circuit, the first digital information being used to generate a corresponding first analog drive signal for the laser diode;
receive a signal from the current measuring device, the signal indicative of actual current flowing through the laser diode upon application of the analog drive signal;
generate second digital information indicating a new current pulse to be applied to the laser diode, the second digital information being based on the first digital information and actual current flowing through the laser diode, wherein the control circuit is further configured to:
compare the actual current flowing through the laser diode to the current value included in the first digital information;
determine that the actual current flowing through the laser diode is not substantially equal to the current value included in the first digital information; and
generate the second digital information based on the determination; and
provide the second digital information to the laser diode driver.

18. The system of claim 17 wherein the control circuit comprises an optical receiver and the first digital information is received via an optical signal.

19. The system of claim 17 wherein the current measuring device is configured to capture optical output from the laser diode and generate a corresponding signal indicative of the actual current flowing through the laser diode.

20. The system of claim 15 wherein the current measuring device comprises a photodiode and wherein the photodiode is configured to:
capture light output from the laser diode;
generate a signal corresponding to the captured light output;
provide the signal to the control circuit, wherein the signal is used by the control circuit to determine the actual current flowing in the laser diode.

21. The system of claim 17 further comprising a beam control system configured to generate the first digital information.

22. The system of claim 17 wherein the control circuit comprises an arbitrary waveform generator.

\* \* \* \* \*